(12) United States Patent
Lu

(10) Patent No.: US 11,063,015 B2
(45) Date of Patent: Jul. 13, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/521,531

(22) Filed: Jul. 24, 2019

(65) Prior Publication Data
US 2021/0028144 A1  Jan. 28, 2021

(51) Int. Cl.
*H01L 21/00* (2006.01)
*H01L 23/00* (2006.01)
*H01L 21/762* (2006.01)

(52) U.S. Cl.
CPC ........ *H01L 24/81* (2013.01); *H01L 21/76205* (2013.01); *H01L 24/08* (2013.01); *H01L 24/12* (2013.01); *H01L 24/16* (2013.01); *H01L 2224/02331* (2013.01); *H01L 2224/13023* (2013.01); *H01L 2224/1607* (2013.01); *H01L 2224/16059* (2013.01); *H01L 2224/16112* (2013.01)

(58) Field of Classification Search
None
See application file for complete search history.

(56) References Cited

U.S. PATENT DOCUMENTS

| 7,754,536 B2 | 7/2010 | Abe et al. |
| 9,917,071 B1 | 3/2018 | Chin et al. |
| 2015/0115440 A1* | 4/2015 | Higuchi ............... H01L 24/81 257/737 |
| 2016/0240513 A1* | 8/2016 | Dang .................. H01L 25/50 |

FOREIGN PATENT DOCUMENTS

CN  1079462800 A  4/2018

* cited by examiner

*Primary Examiner* — Reema Patel
(74) *Attorney, Agent, or Firm* — Foley & Lardner LLP

(57) ABSTRACT

A semiconductor device package includes a first substrate having a first surface, a first electrical contact disposed on the first surface of the first substrate, a second substrate having a second surface facing the first surface of the first substrate, and a second electrical contact disposed on the second surface of the second substrate. The first electrical contact has a base portion and a protrusion portion. The second electrical contact covers at least a portion of the protrusion portion of the first electrical contact. The second electrical contact has a first surface facing the first substrate and a second surface facing the second substrate. A slope of a first interface between the second electrical contact and the protrusion portion of the first electrical contact adjacent to the first surface of the second electrical contact is substantially the same as a slope of a second interface between the second electrical contact and the protrusion portion of the first electrical contact adjacent to the second surface of the second electrical contact. A method of manufacturing a semiconductor device package is also disclosed.

17 Claims, 39 Drawing Sheets

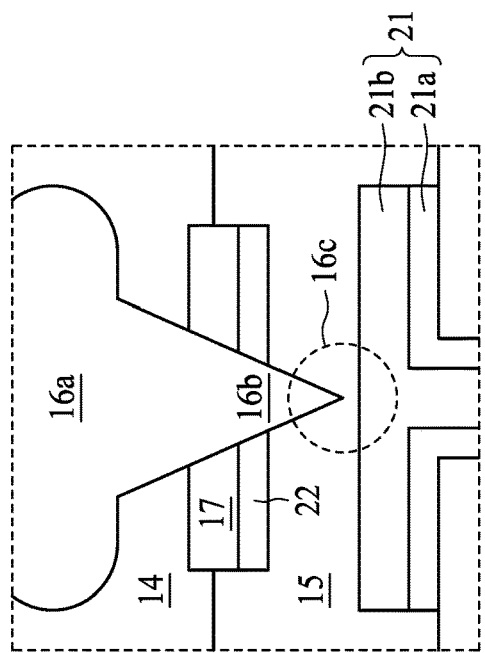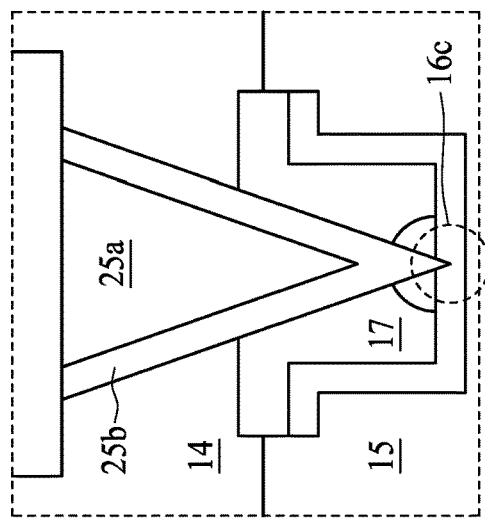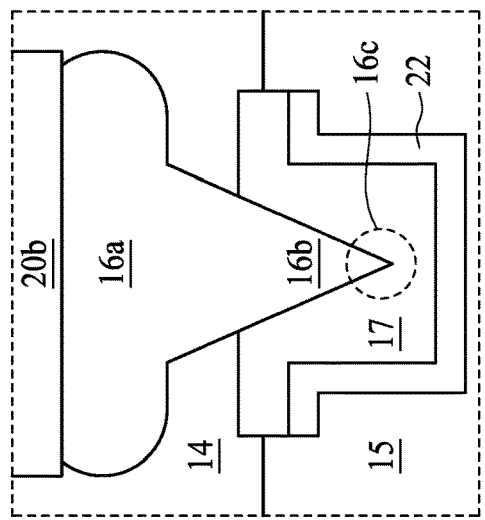

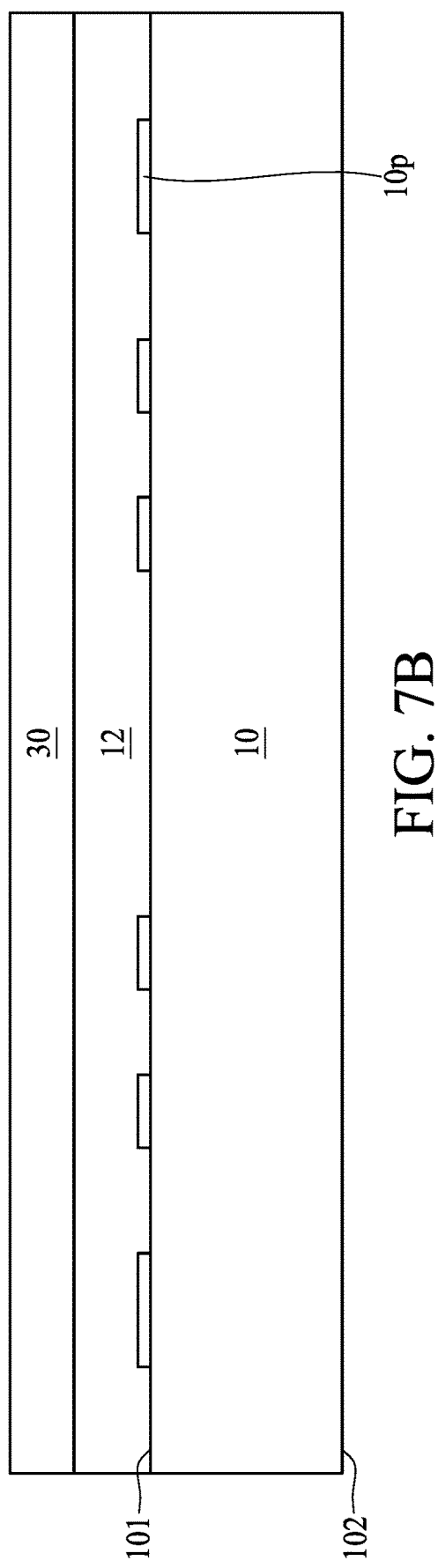

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same, and to a semiconductor device package including a protrusion portion.

2. Description of the Related Art

In semiconductor structures, conductive pillars (for example, copper (Cu) pillars or bumps) are used as interconnections. As the pitch of the conductive pillars becomes further reduced to accommodate increasing I/O numbers, it becomes more challenging to align the interconnections. In addition, the aligned conductive pillars may laterally slip when the lateral force is applied, making the interconnections fail.

SUMMARY

In one or more embodiments, a semiconductor device package includes a first substrate having a first surface, a first electrical contact disposed on the first surface of the first substrate, a second substrate having a second surface facing the first surface of the first substrate, and a second electrical contact disposed on the second surface of the second substrate. The first electrical contact has a base portion and a protrusion portion. The second electrical contact covers at least a portion of the protrusion portion of the first electrical contact. The second electrical contact has a first surface facing the first substrate and a second surface facing the second substrate. A slope of a first interface between the second electrical contact and the protrusion portion of the first electrical contact adjacent to the first surface of the second electrical contact is substantially the same as a slope of a second interface between the second electrical contact and the protrusion portion of the first electrical contact adjacent to the second surface of the second electrical contact.

In one or more embodiments, a semiconductor device package includes a first substrate having a first surface, a first electrical contact disposed on the first surface of the first substrate, a second substrate having a second surface facing the first surface of the first substrate, and a second electrical contact disposed on the second surface of the second substrate. The first electrical contact has a base portion and a protrusion portion. The second electrical contact covers at least a portion of the protrusion portion of the first electrical contact. The second electrical contact has a first surface facing the first substrate and a second surface facing the second substrate. A grain size of the first electrical contact adjacent to an interface between the protrusion portion of the first electrical contact and the second electrical contact is smaller than a grain size at any other portion of the first electrical contact far away from the interface.

In one or more embodiments, a method of manufacturing a semiconductor device package includes providing a first substrate having a first surface and providing a second substrate having a second surface. The method further includes forming a first electrical contact on the first surface of the first substrate and forming a second electrical contact on the second surface of the second substrate. The first electrical contact has a base portion and a protrusion portion. The method further includes connecting the first substrate to the second substrate by inserting the protrusion of the electrical contact into the second electrical contact to deform the second electrical contact.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 1F illustrates a cross-sectional view of a part of a semiconductor device package in accordance with some embodiments of the present disclosure.

FIG. 1G illustrates a cross-sectional view of a part of a semiconductor device package in accordance with some embodiments of the present disclosure.

FIG. 1H illustrates a cross-sectional view of a part of a semiconductor device package in accordance with some embodiments of the present disclosure.

FIG. 7B illustrates one or more stages of a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
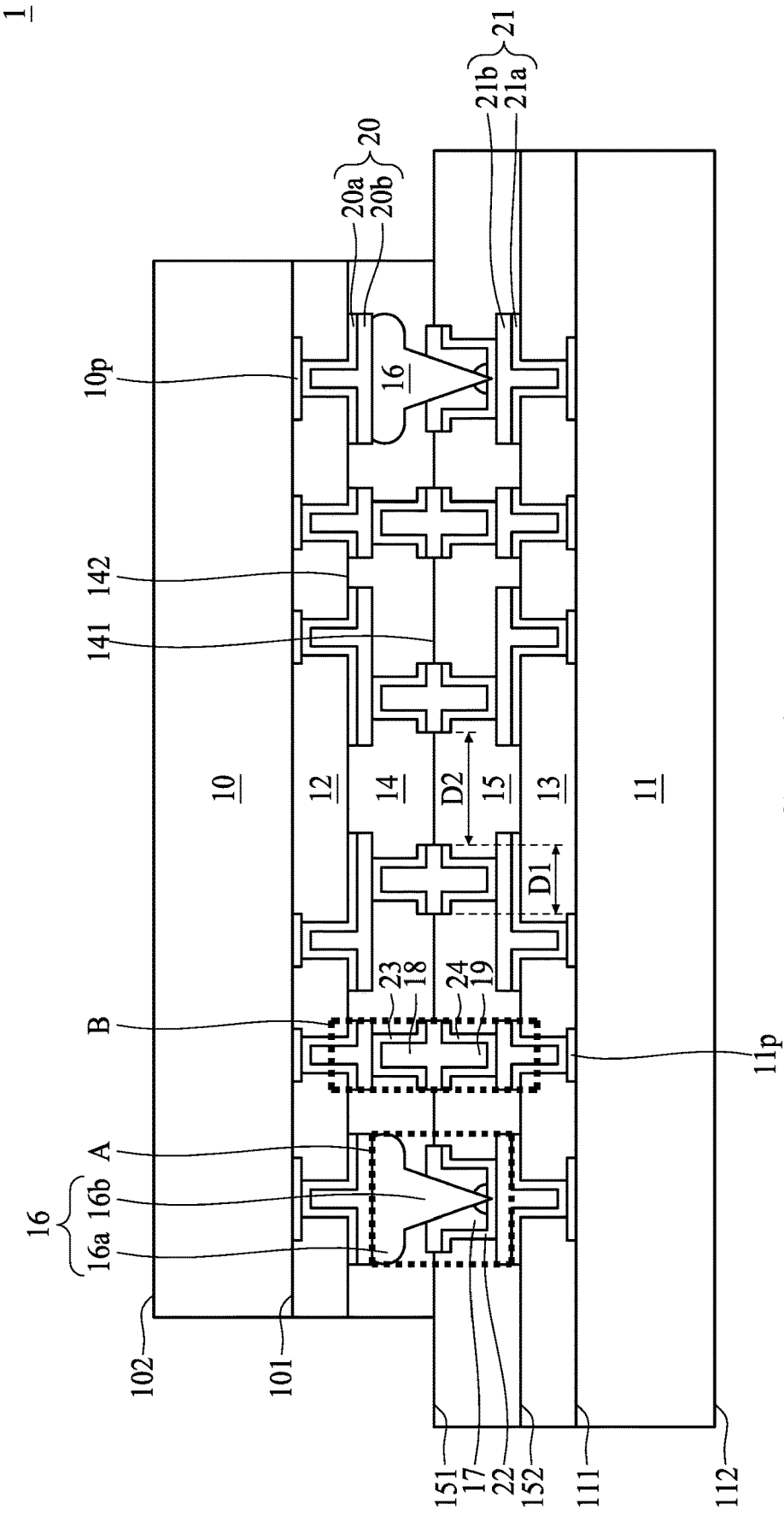
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Referring to FIG. 1A, FIG. 1A illustrates a cross-sectional view of a semiconductor device package 1 in accordance with some embodiments of the present disclosure. The semiconductor device package 1 includes substrates 10 and 11, dielectric layers 12, 13, 14 and 15, electrical contacts 16, 17, 18, and 19, and conductive layers 20, 21, 22, 23, and 24.

In some embodiments, the substrate 10, the dielectric layers 12 and 14, the electrical contacts 16 and 18, and the conductive layers 20 and 23 are collectively referred to as a first semiconductor structure. In some embodiments, the substrate 11, the dielectric layers 13 and 15, the electrical contacts 17 and 19, and the conductive layers 21, 22 and 24 are collectively referred to as a second semiconductor structure. The first semiconductor structure and the second semiconductor structure are electrically connected to each other through the connection between the electrical contacts 18 and 19, and the connection between the electrical contacts 16 and 17.

The substrate 10 may include, for example, a semiconductor substrate or a wafer, such as crystalline silicon (c-Si). In some embodiments, the substrate 10 may include, for example, a chip, a die, or an electronic component including a semiconductor substrate. In some embodiments, the substrate 10 may include, for example, a printed circuit board, such as a paper-based copper foil laminate, a composite copper foil laminate, or a polymer-impregnated glass-fiber-based copper foil laminate. In some embodiments, the substrate 10 may include one or more integrated circuit devices and one or more overlying interconnection structures, such as a redistribution layer (RDL) or a grounding element. The one or more integrated circuit devices may include active devices such as transistors and/or passive devices such as resistors, capacitors, inductors, or a combination of two or more thereof. In some embodiments, the substrate 11 includes substantially the same structure and materials as the substrate 10.

The substrate 10 has a surface (or active surface) 101 and a surface (or back surface) 102 opposite to the surface 101. The substrate 11 has a surface 111 and a surface 112 opposite to the surface 111. The surfaces 101 and 111 face each other. The dielectric layers 12 and 14 are disposed on the surface 101. The dielectric layers 13 and 15 are disposed on the surface 111. The dielectric layers 12, 13, 14 and 15 are between the surface 101 and the surface 111.

Each of the dielectric layers 12, 13, 14 and 15 may include, for example, organic material(s) (such as, a solder mask, a polyimide (PI), an epoxy, an Ajinomoto build-up film (ABF), a polypropylene (PP), and a bismaleimide triazine (BT)), inorganic material(s) (such as a silicon oxide ($SiO_x$), a silicon nitride ($SiN_x$), a tantalum oxide ($TaO_x$), silicon, a glass, a ceramic, and quartz), or a combination of two or more thereof.

The conductive layer 20 is disposed on a surface of the dielectric layer 12 facing the surface 111 and extends into the dielectric layer 12 to be electrically connected to conductive pads 10*p* on the surface 101 of the substrate 10. The conductive layer 21 is disposed on a surface of the dielectric layer 13 facing the surface 101 and extends into the dielectric layer 13 to be electrically connected to conductive pads 11*p* on the substrate 11.

The conductive layer 20 may include a multi-layered conductive layer. In some embodiments, the conductive layer 20 includes a seed layer 20*a* and a metal layer 20*b*. The seed layer 20*a* may include, for example, titanium (Ti), copper (Cu), Nickel (Ni), another metal, or an alloy (such as a titanium-tungsten alloy (TiW)). The metal layer 20*b* may include, for example, gold (Au), silver (Ag), Cu, Ni, palladium (Pd), another metal, a solder alloy, or a combination of two or more thereof.

The conductive layer 21 may include a multi-layered conductive layer. In some embodiments, the conductive layer 21 includes a seed layer 21*a* and a metal layer 21*b*. In some embodiments, the conductive layer 21 includes the materials as listed above for the conductive layer 20. In some embodiments, the conductive layers 20 and 21 are RDLs.

As shown in FIG. 1A, the dielectric layer 14 includes a surface 141 facing the substrate 11 and a surface 142 opposite to the surface 141. The dielectric layer 14 defines recesses or holes from the surface 141 toward the surface 142 to expose several portions of the conductive layer 20. The conductive layer 23 is disposed on the sidewalls and the bottom surfaces of the recesses in the dielectric layer 14. The electrical contact 18 is disposed within the recesses and on the conductive layer 23. The conductive layer 23 and the electrical contact 18 are electrically connected to the conductive pads 10*p* through the conductive layer 20.

Similar to the dielectric layer 14, the dielectric layer 15 includes a surface 151 facing the substrate 10 and a surface 152 opposite to the surface 151. The dielectric layer 15 defines recesses or holes from the surface 151 toward the surface 152 to expose portions of the conductive layer 21. The conductive layer 24 and the conductive layer 22 are disposed on the sidewalls and the bottom surfaces of the recesses in the dielectric layer 15. The electrical contact 19 and the electrical contact 17 are disposed within the recesses and on the conductive layer 24 and the conductive layer 22, respectively. The conductive layer 24 and the electrical contact 19 are electrically connected to the conductive pads 11*p* through the conductive layer 21. The conductive layer 22 and the electrical contact 17 are electrically connected to the conductive pads 11*p* through the conductive layer 21.

The conductive layers 22, 23 and 24 are seed layers. Each of the conductive layers 22, 23, and 24 may include, for example, Ti, Cu, Ni, another metal, or an alloy (such as a TiW).

Each of the electrical contacts 17, 18, and 19 may include, for example, Au, Ag, Cu, Ni, Pd, another metal, a solder alloy, or a combination of two or more thereof.

The electrical contact 18 and the electrical contact 19 are connected to each other and together provide electrical connection for the first semiconductor structure and the second semiconductor structure. The electrical contact 18 and the electrical contact 19 are in contact with each other by an interface. In some embodiments, the interface between the electrical contact 18 and the electrical contact 19 is substantially coplanar with the interface between the dielectric layer 14 and the dielectric layer 15.

Referring to FIG. 1A, the electrical contact 16 is disposed on the conductive layer 20 and electrically connected to the conductive pads 10*p* through the conductive layer 20. The electrical contact 16 may include, for example, Au, Ag, Cu, Ni, aluminum (Al), another metal, a solder alloy, or a combination of two or more thereof.

As shown in FIG. 1A, the electrical contact 16 inserts into the electrical contact 17 to deform the electrical contact 17. The electrical contact 16 includes a base portion 16*a* and a protruding portion 16*b* disposed on and/or protruding from the base portion 16*a*. In some embodiments, the electrical contact 16 may be a conductive bump or a stud bump. In some embodiments, the base portion 16*a* includes a bump. In some embodiments, the protruding portion 16*b* includes a stud.

The protruding portion 16*b* of the electrical contact 16 inserts, stabs, or sticks the electrical contact 17. In some embodiments, the protruding portion 16*b* of the electrical contact 16 may further insert, stab, or stick at least a portion of the conductive layer 22. In other words, the protruding portion 16*b* of the electrical contact 16 is pressed, or squeezed into the electrical contact 17 and/or the conductive layer 22.

The electrical contact 16 is covered or surrounded by the dielectric layer 14, the electrical contact 17, and/or the conductive layer 22. For examples, the protruding portion 16*b* of the electrical contact 16 includes an upper portion, a middle portion, and a lower portion. The upper portion is covered or surrounded by the dielectric layer 14. The middle portion is covered or surrounded by the electrical contact 17. The lower portion covered or surrounded by the conductive layer 22. In some embodiments, the upper portion is in contact with the dielectric layer 14. The middle portion is in contact with the electrical contact 17. The lower portion in contact with the conductive layer 22.

Inserting the protruding portion 16b into the electrical contact 17 and/or the conductive layer 22 to deform the electrical contact 17 and/or the conductive layer 22 would increase the connection force between the electrical contacts 16 and 17, which can avoid the disconnection between the electrical contacts 16 and 17 due to the lateral shift when a lateral force is applied. In addition, since the protruding portion 16b of the electrical contact 16 is in contact with the electrical contact 17, there is no void or gap existing between the electrical contacts 16 and 17, which would avoid crack or other issues (e.g., weak connection).

The positions of each of the electrical contacts 16, 17, 18, and 19 can be set depending on design specifications. For examples, the electrical contacts 16 may be arranged on several specific positions over the substrate 10 to serve as anchors for aligning and combining the first semiconductor structure and the second semiconductor structure.

In addition, the numbers of each of the electrical contacts 16, 17, 18, and 19 can be set depending on design specifications. For examples, there could be more electrical contacts than those depicted in FIG. 1A to achieve a higher bonding force between the first and second semiconductor structures.

In some embodiments, the dielectric layer 12 includes a thickness from about 0.5 micrometers (μm) to about 5.5 μm. In some embodiments, the dielectric layer 13 includes a thickness from about 0.5 μm to about 5.5 μm. In some embodiments, the dielectric layer 14 includes a thickness from about 3 μm to about 17 μm. In some embodiments, the dielectric layer 15 includes a thickness from about 3 μm to about 17 μm. In some embodiments, the total thickness of the semiconductor device package 1 is equal to or less than about 80 μm.

In some embodiments, the line space (L/S, e.g., d1/d2) of the electrical contacts 17, 18, and 19 is equal to or less than 5 μm/5 μm or equal to or less than 2 μm/2 μm.

Figure 1C:
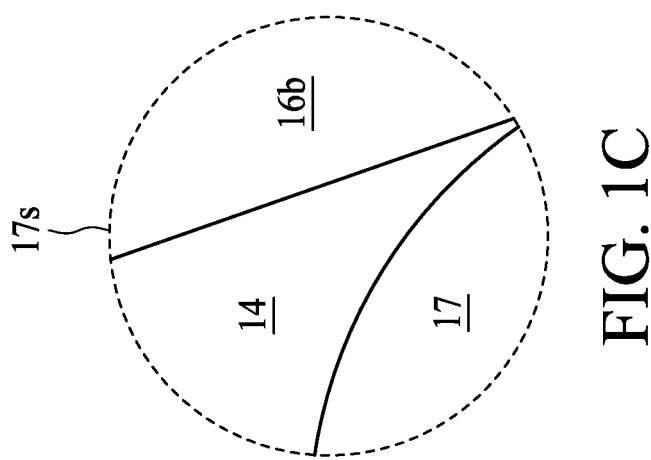
FIG. 1C illustrates an enlarged view of a portion of the semiconductor device package in a dotted circle C as shown in FIG. 1B in accordance with some embodiments of the present disclosure.
Figure 1B:
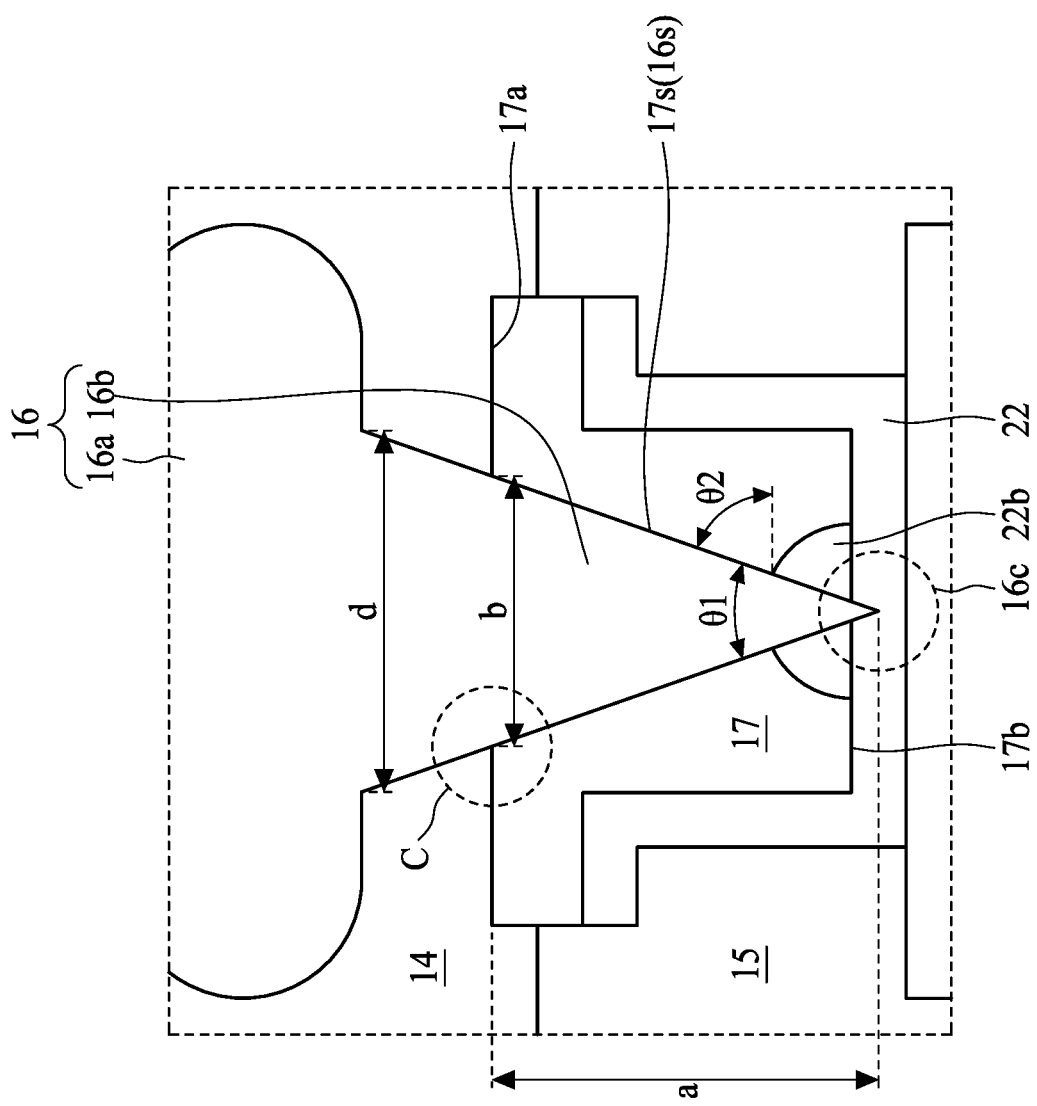
FIG. 1B illustrates an enlarged view of a portion of the semiconductor device package in a dotted box A as shown in FIG. 1A in accordance with some embodiments of the present disclosure.

FIG. 1B illustrates an enlarged view of a portion of the semiconductor device package 1 in a dotted box A as shown in FIG. 1A in accordance with some embodiments of the present disclosure. FIG. 1C illustrates an enlarged view of a portion in a dotted circle C as shown in FIG. 1B in accordance with some embodiments of the present disclosure.

As shown in FIG. 1B, the protruding portion 16b of the electrical contact 16 is squeezed by the electrical contact 17 and the conductive layer 22 to form a bump structure 22b. The bump structure 22b surrounds a tip portion (or a contact point 16c) of the protruding portion 16b of the electrical contact 16. The bump structure 22b is in contact with the electrical contact 17 and the protruding portion 16b. The electrical contact 17 covers or surrounds the bump structure 22b, and the bump structure 22b further cover or surround the protruding portion 16b. The protruding portion 16b is covered or surrounded by the bump structure 22b, and the bump structure 22b is further covered or surrounded by the electrical contact 17. A part of the bump structure 22b may be vertically overlapped with the conductive layer 22 and the protruding portion 16b, and providing an adhesion force to fix the protruding portion 16b.

As shown in FIG. 1B, the electrical contact 17 has a surface 17a facing the substrate 10 (not shown in FIG. 1B), a surface 17b facing the substrate 11 (not shown in FIG. 1B), and a sidewall 17s extending from the surface 17a to the surface 17b. In some embodiments, the surface 17a is substantially planar. In some embodiments, as shown in FIG. 1C, the surface 17a recesses inwardly toward the surface 17b. For examples, there is a gap between the electrical contact 17 and the protruding portion 16b adjacent to the surface 17a. In some embodiments, a part of the dielectric layer 14 may be within the gap.

The protruding portion 16b has a sidewall 16s in contact with the electrical contact 17, the bump structure 22b, and the conductive layer 22. The sidewall 16s tightly abuts or adjoins the electrical contact 17, the bump structure 22b, and the conductive layer 22. For examples, the interface between the protruding portion 16b and the electrical contact 17 are substantially void free. The interface between the sidewall 16s and the bump structure 22b are substantially void free. The interface between the sidewall 16s and the conductive layer 22 are substantially void free.

The annotation "θ2" is the angle defined by the sidewall 17s of the electrical contact 17 and an imaginary plane parallel to the surface 111 of the substrate 11 (not shown in FIG. 1B). A slope (e.g., tan θ2) of the sidewall 17s is substantially constant. For examples, a slope of the sidewall 17s adjacent to the surface 17a is substantially the same as a slope of the sidewall 17s adjacent to the surface 17b. For examples, the slope of the sidewall 17s contacting the protruding portion 16b is substantially the same as the slope of the sidewall 17s contacting the bump structure 22b. For examples, the slope of the sidewall 17s contacting the protruding portion 16b is substantially the same as the slope of the sidewall 17s contacting the conductive layer 22. The slope of the sidewall 17s is substantially equal to the slope of the sidewall 16s and is also substantially equal to a slope (e.g., tan θ2) of the interface between the protruding portion 16b and the electrical contact 17.

The annotation "d" is the width of the bottommost surface of the protruding portion 16b, "b" is the width of the level surface of the protruding portion 16b that inserted in the electrical contact 17, and "a" is the distance between the level surface and a contact point 16c (e.g., the farthest point from the base portion 16a). In some embodiments, "b" is substantially equal to a value from 0.3 d to 2.0 d, such as a value from 0.5 d to 1.6 d. In some embodiments, "a" is substantially equal to a value from 0.1 d to 1.0 d, such as from 0.3 d to 0.68 d.

The annotation "θ1" is the angle defined by sidewalls cut through the widest portion of the electrical contact 16 and is also the edge of the contact point 16c. In some embodiments, θ1 is in a range from about 0 degree to about 90 degrees, such as from about 10 degrees to about 80 degrees or from about 15 degrees to about 75 degrees. In some embodiments, the interior angle θ1 may be set depending on design specifications, for examples, by taking into considerations the interactions between the protruding portion 16b and the electrical contact 17, such as the adhesion strength and shear strength therebetween.

In some embodiments, the hardness of the protruding portion 16b is higher than any one of the base portion 16a, the electrical contact 17, and the conductive layer 22.

In some embodiments, the hardness of the protruding portion 16b ranges from about 110 HV (Vickers Pyramid Number) to about 250 HV, such as from about 160 HV to about 200 HV. In some embodiments, the hardness of the base portion 16a ranges from about 100 HV to about 180 HV, such as from about 120 HV to about 150 HV. In some embodiments, the hardness of the electrical contact 17 ranges from about 10 HV to about 100 HV such as from about 20 HV to about 90 HV, or from about 30 HV to about 50 HV.

In some embodiments, since the hardness of the protruding portion 16b is greater than the electrical contact 17 and/or the conductive layer 22, the protruding portion 16b can be squeezed into the electrical contact 17 and/or the conductive layer 22 without being cracked or broken.

In some embodiments, the protruding portion 16b can be positioned on the electrical contact 17 precisely, which achieves a highly accurate alignment between the first semiconductor structure and the second semiconductor structure. For example, the protruding portion 16b of the electrical contact 16 can be connected to a fine-pitch conductive trace or pad (e.g., line space equal to or less than 2 μm/2 μm).

In addition, once the alignment is done, the protruding portion 16b can stab and deform the electrical contact 17 and/or the conductive layer 22, inducing a grain deformation along the interface therebetween. Therefore, the electrical contact 17 and/or the conductive layer 22 engage the protruding portion 16b and prevent the protruding portion 16b from slipping laterally.

In some embodiments, the shear strength between the protruding portion 16b and the electrical contact 17 and/or the conductive layer 22 is in a range from about 60 MPa to about 100 MPa. In some embodiments, the adhesion strength between the protruding portion 16b and the electrical contact 17 and/or the conductive layer 22 is in a range from about 180 MPa to about 300 MPa.

Figure 1E:
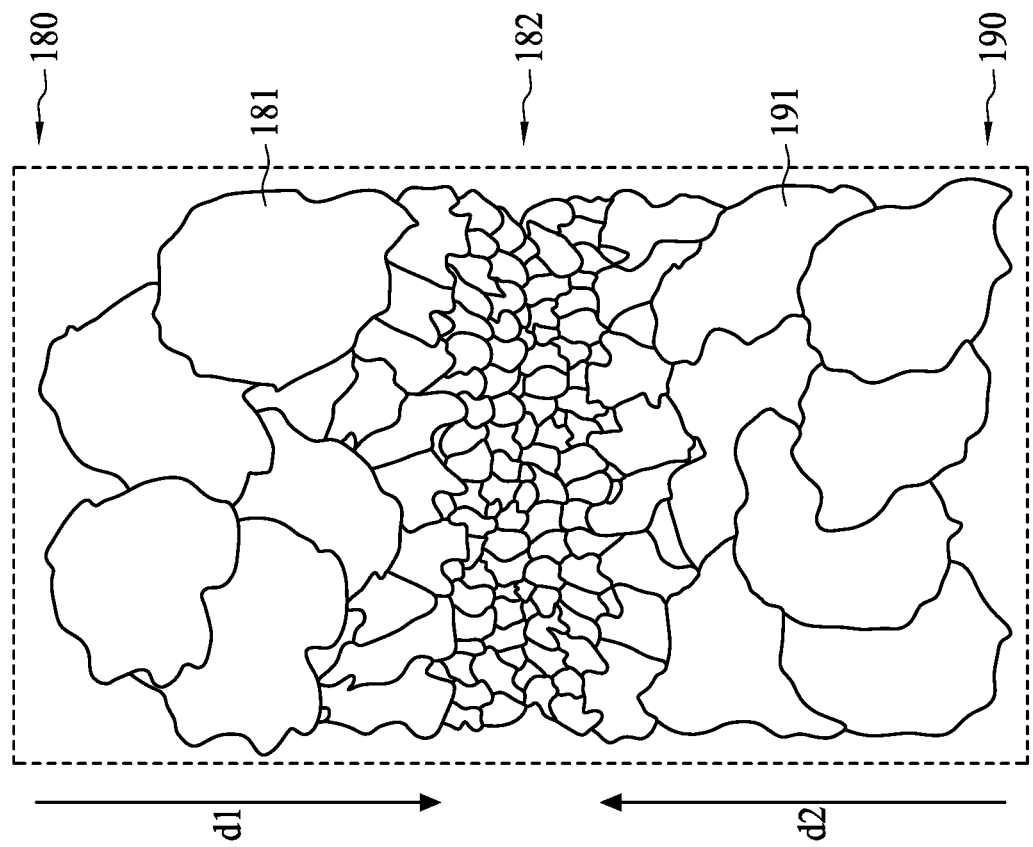
FIG. 1E illustrates an enlarged view of a portion of the semiconductor device package in a dotted box D as shown in FIG. 1D in accordance with some embodiments of the present disclosure.
Figure 1D:
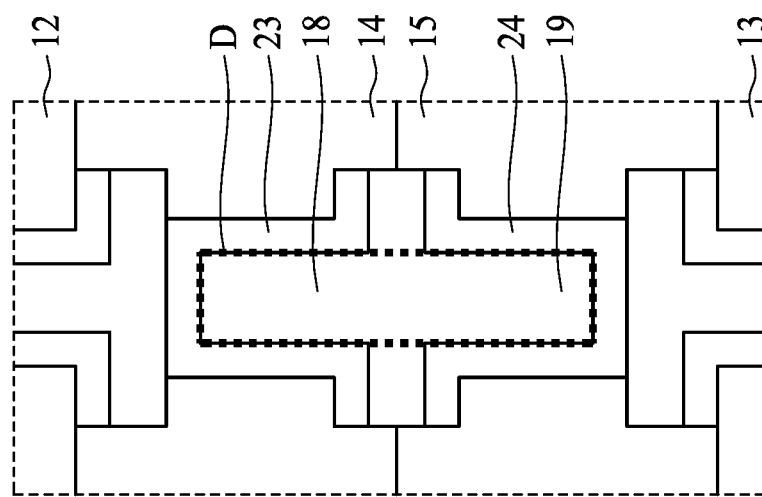
FIG. 1D illustrates an enlarged view of a portion of the semiconductor device package in a dotted box B as shown in FIG. 1A in accordance with some embodiments of the present disclosure.

FIG. 1D illustrates an enlarged view of a portion in a dotted box B as shown in FIG. 1A in accordance with some embodiments of the present disclosure. FIG. 1E illustrates an enlarged view of a portion in a dotted box D as shown in FIG. 1D in accordance with some embodiments of the present disclosure.

In some embodiments, as shown in FIG. 1E, the interface 182 between the electrical contact 18 and the electrical contact 19 is a staggered surface or a reeled surface. In some embodiments, the electrical contact 18 and the electrical contact 19 may have material having matching lattices such that they can form a linked or interlocked structure through heat treatment (such as annealing).

The grain size in the electrical contact 18 becomes smaller along a direction d1 from a bottom portion 180 of the electrical contact 18 toward the interface 182. The grain size in the electrical contact 19 becomes smaller along a direction d2 from a bottom portion 190 of the electrical contact 19 toward the interface 182. In some embodiments, the grain size at the interface 182 is smaller than any other portion in the electrical contact 18 and the electrical contact 19.

In some embodiments, as shown in FIG. 1E, the grain density becomes higher along the direction d1 and the direction d2. In some embodiments, the grain density at the interface 182 is higher than any other portion in the electrical contact 18 and the electrical contact 19.

Referring to FIG. 1F, FIG. 1G, and FIG. 1H, which illustrate cross-sectional views of a part of a semiconductor device package in accordance with different embodiments of the present disclosure.

The structure in FIG. 1F is similar to the structure in FIG. 1B, except that the contact point 16c contacts the electrical contact 17, but is spaced apart from the conductive layer 22. The electrical contact 17 covers or surrounds the contact point 16c.

The structure in FIG. 1G is similar to the structure in FIG. 1B, except that the electrical contact 16 in FIG. 1B is replaced with a filling material 25a and a cap layer 25b covering the filling material 25a. In some embodiments, the cap layer 25b may include materials such as those listed above for the electrical contact 16.

The structure in FIG. 1H is similar to the structure in FIG. 1B, except that the electrical contact 16 penetrates a portion of the conductive layer 22. The contact point 16c of the electrical contact 16 is covered or surrounded by the dielectric layer 15. In some embodiments, the contact point 16c is in contact with the conductive layer 21. In some embodiments, the contact point 16c penetrates a portion of the conductive layer 21 and is covered or surrounded by the conductive layer 21.

Figure 2A:
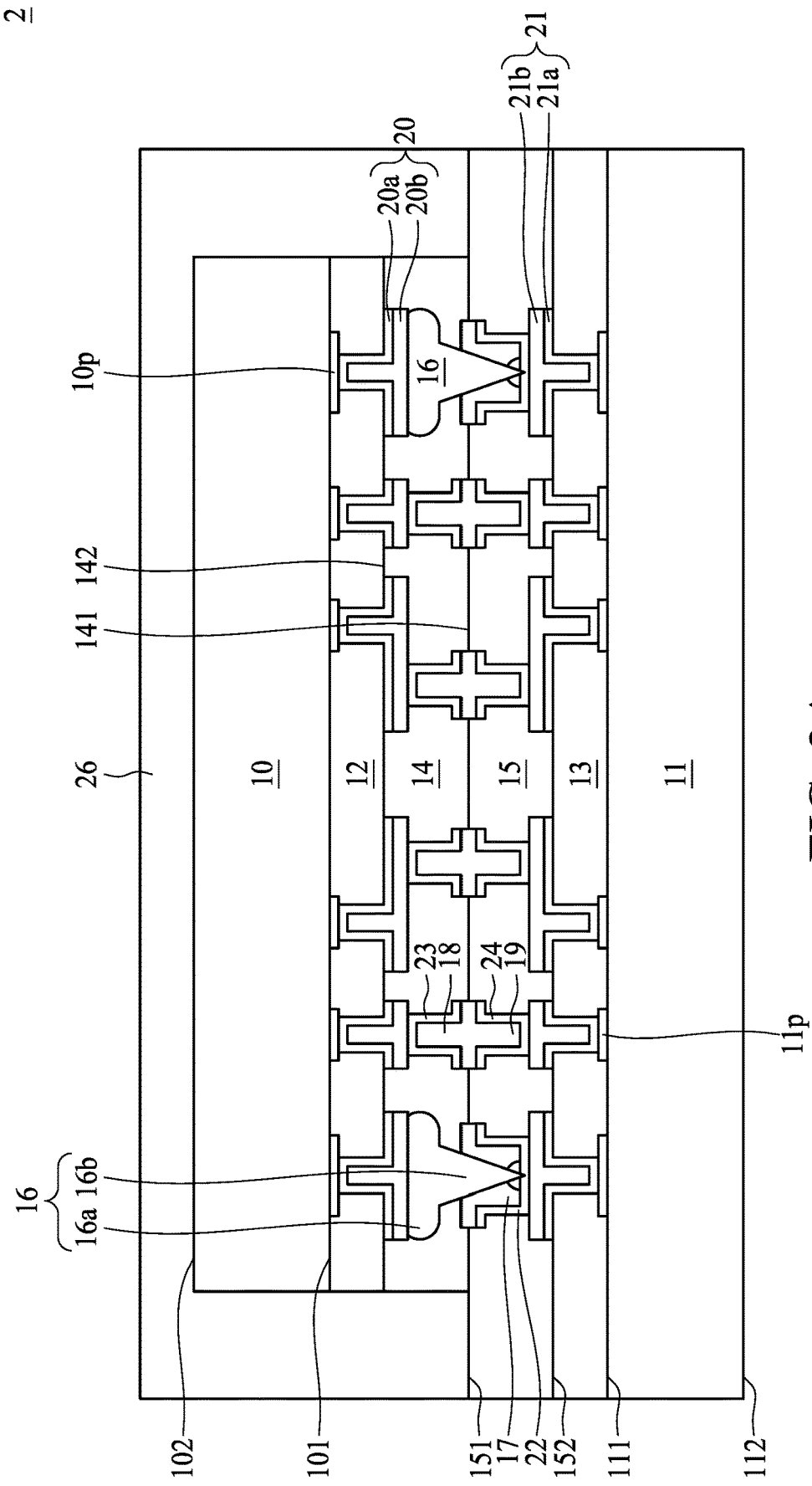
FIG. 2A illustrates a cross-sectional view of a semiconductor device package in accordance with some embodiments of the present disclosure.

FIG. 2A illustrates a cross-sectional view of a semiconductor device package 2 in accordance with some embodiments of the present disclosure. The semiconductor device package 2 is similar to the semiconductor device package 1 in FIG. 1A except that the semiconductor device package 2 includes a package body 26 covering or encapsulating the substrate 10. The package body 26 covers the surface 102 and lateral surfaces of the substrate 10. The package body 26 also covers the surface 151 of the dielectric layer 15. An external sidewall of the package body 26 is coplanar with an external sidewall of the semiconductor device package 2.

In some embodiments, the package body 26 includes, for example, organic materials (e.g., a molding compound, BT, a PI, a polybenzoxazole (PBO), a solder resist, an ABF, a PP, an epoxy-based material, or a combination of two or more thereof), inorganic materials (e.g., silicon, a glass, a ceramic, a quartz, or a combination of two or more thereof), or a combination of two or more thereof. In some embodiments, the package body 26 covering or encapsulating the substrate 10 may be replaced by a sealing layer or a passivation layer.

Figure 2B:
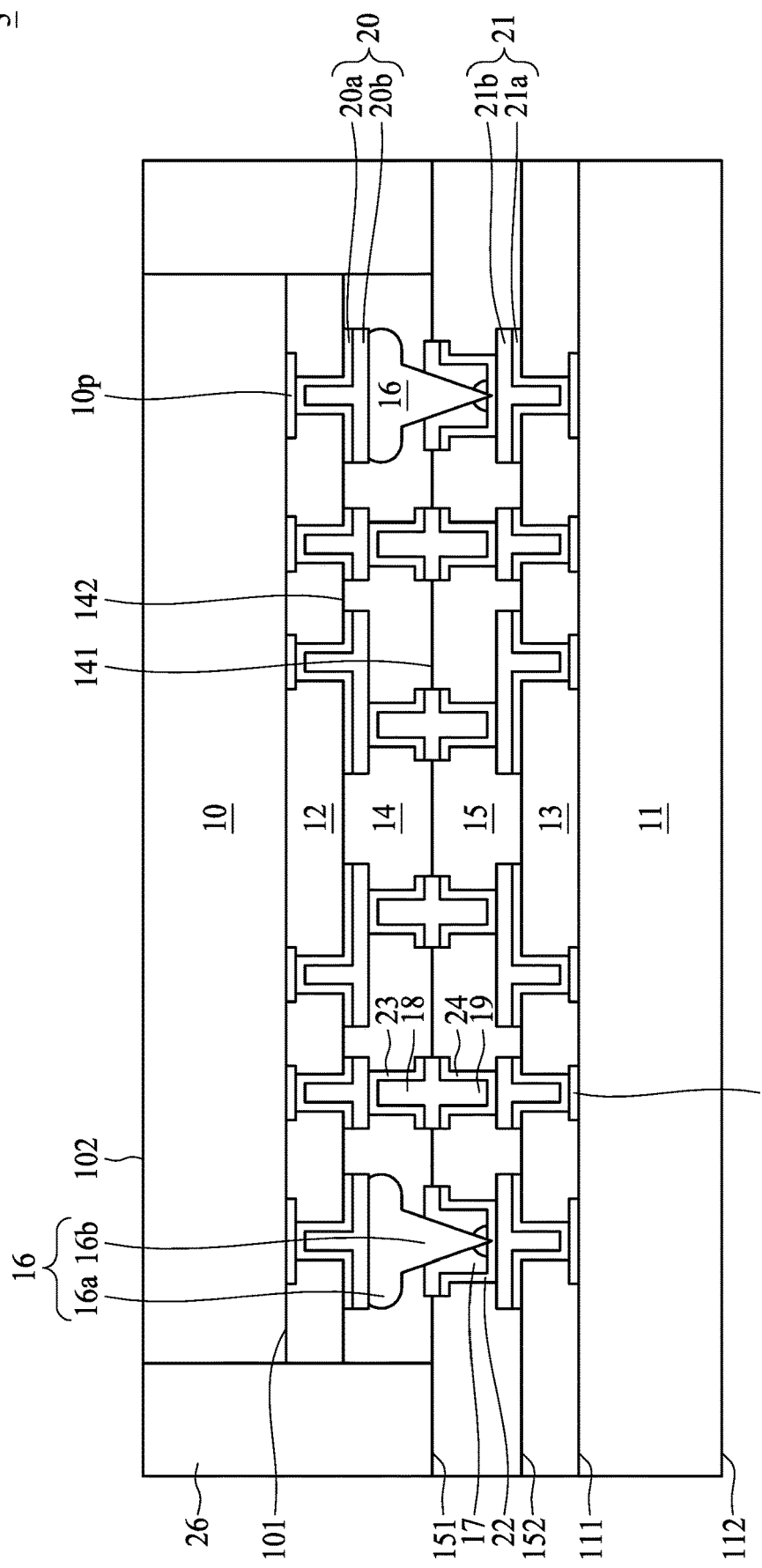
FIG. 2B illustrates a cross-sectional view of a semiconductor device package in accordance with some embodiments of the present disclosure.

FIG. 2B illustrates a cross-sectional view of a semiconductor device package 3 in accordance with some embodiments of the present disclosure. The semiconductor device package 3 is similar to the semiconductor device package 2 in FIG. 2A except that the surface 102 of the substrate 10 is exposed from the package body 26.

Figure 2C:
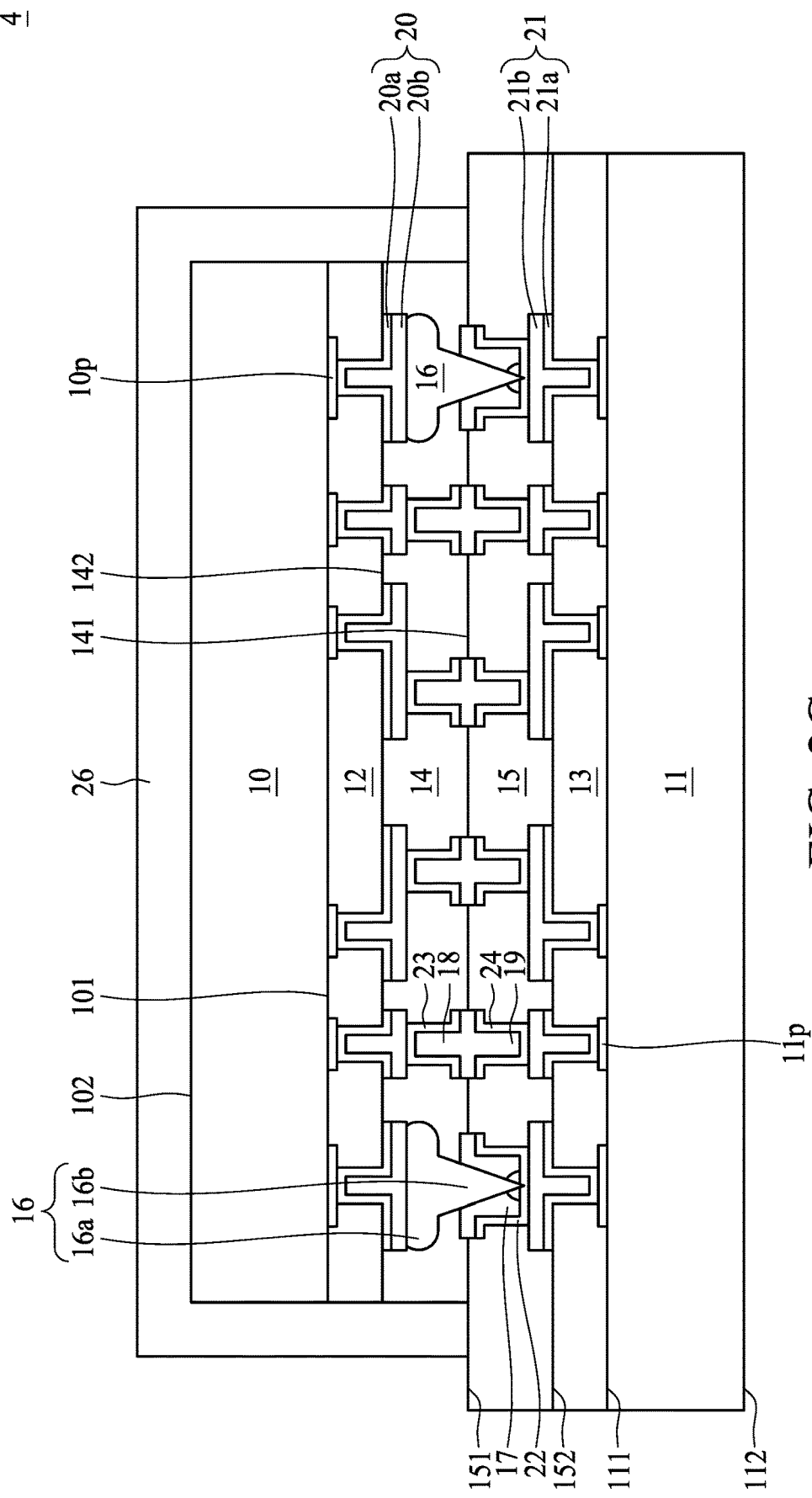
FIG. 2C illustrates a cross-sectional view of a semiconductor device package in accordance with some embodiments of the present disclosure.

FIG. 2C illustrates a cross-sectional view of a semiconductor device package 4 in accordance with some embodiments of the present disclosure. The semiconductor device package 4 is similar to the semiconductor device package 2 in FIG. 2A except that an external sidewall of the package body 26 of the semiconductor device package 4 is laterally recessed with respect to an external sidewall of the semiconductor device package 4. An external sidewall of the package body 26 of the semiconductor device package 4 is not coplanar with an external sidewall of the semiconductor device package 4. A portion of the surface 151 of the dielectric layer 15 is exposed.

Figure 3:
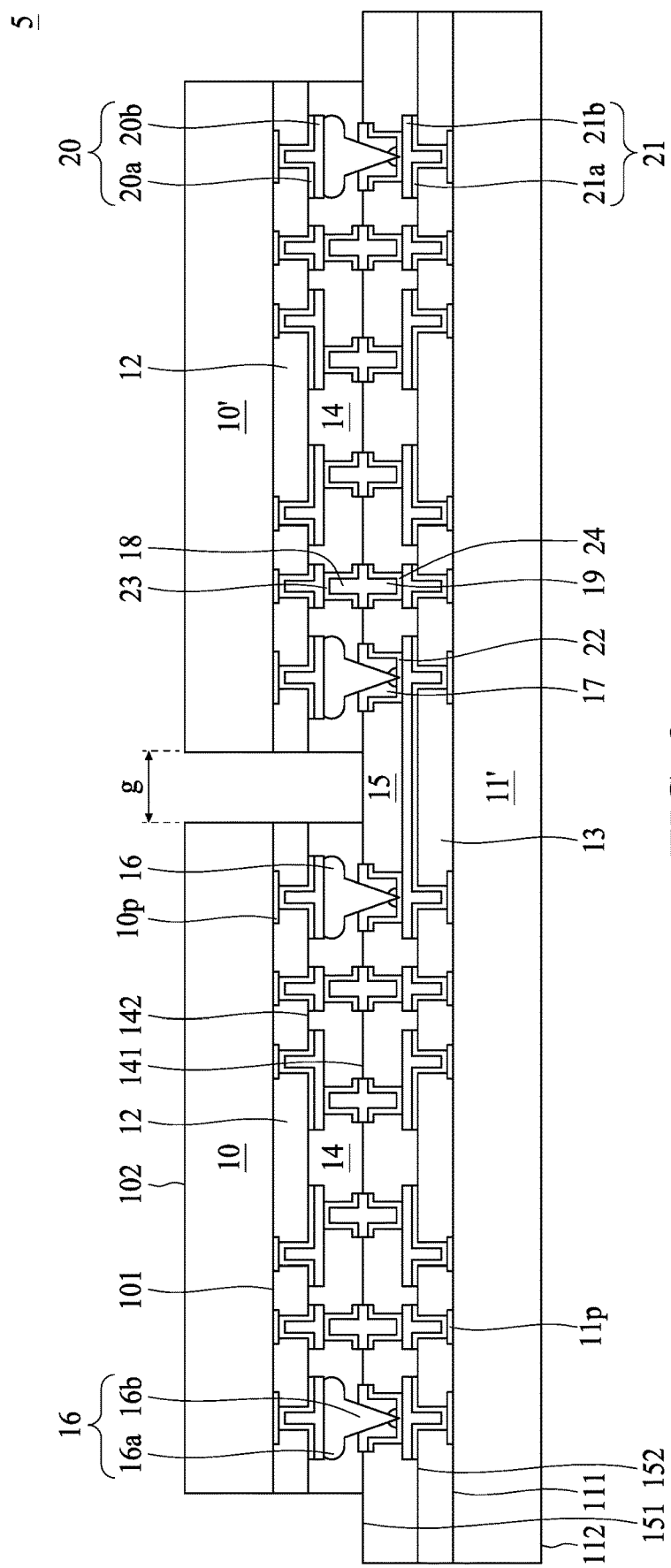
FIG. 3 illustrates a cross-sectional view of a semiconductor device package in accordance with some embodiments of the present disclosure.

FIG. 3 illustrates a cross-sectional view of a semiconductor device package 5 in accordance with some embodiments of the present disclosure. The semiconductor device package 5 in FIG. 3 is similar to the semiconductor device package 1 in FIG. 1A, except that the semiconductor device package 5 in FIG. 3 further includes a substrate 10' spaced apart from the substrate 10 by a gap (denoted as "g" in FIG. 3). In some embodiments, there may be any number of substrates combined with the substrate 11 depending on different design specifications.

Figure 4:
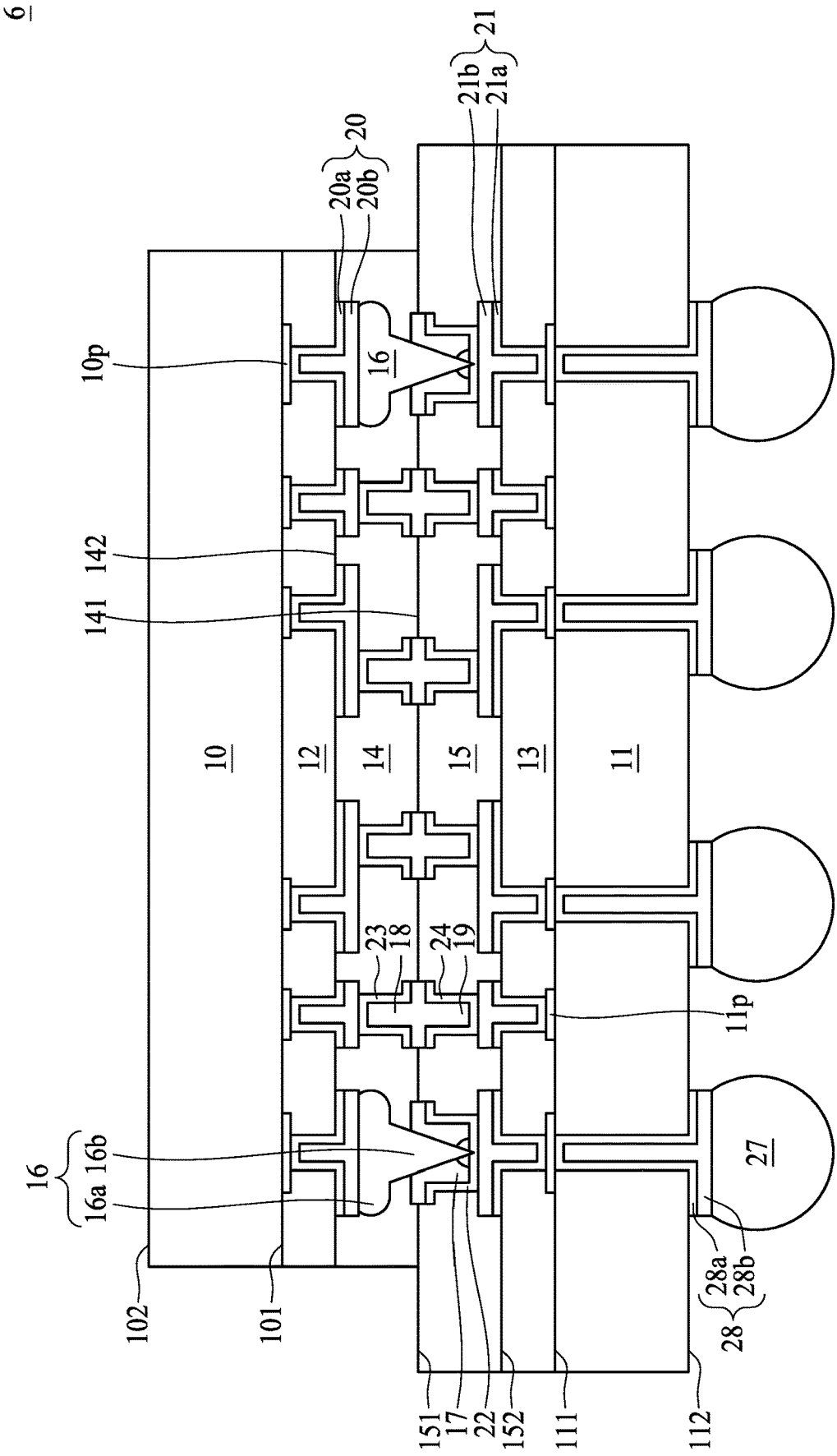
FIG. 4 illustrates a cross-sectional view of a semiconductor device package in accordance with some embodiments of the present disclosure.

FIG. 4 illustrates a cross-sectional view of a semiconductor device package 6 in accordance with some embodiments of the present disclosure. The semiconductor device package 6 in FIG. 4 is similar to the semiconductor device package 1 in FIG. 1A, except that the semiconductor device package 6 in FIG. 4 includes one or more solder bumps 27 (e.g. a solder ball). The solder bump 27 is disposed on the surface 112 of the substrate 11 and can provide electrical connections between the semiconductor device package 6 and external components (e.g. external circuits or circuit boards).

The solder bump 27 is electrically connected to the conductive layer 21 through a conductive layer 28. In some embodiments, the conductive layer 28 includes substantially the same structure and materials as the conductive layer 21. The conductive layer 28 includes a seed layer 28*a* and a metal layer 28*b*. In some embodiments, the conductive layer 28 is RDL.

In some embodiments, the solder bump 27 includes a controlled collapse chip connection (C4) bump, a ball grid array (BGA) or a land grid array (LGA). In some embodiments, the solder bump 27 can be used for a fan-in structure, a fan-out structure or a combination of the fan-in and fan-out structure. In some embodiments, there may be any number of solder bumps 27 on the substrate 11 depending on design specifications.

Figure 5:
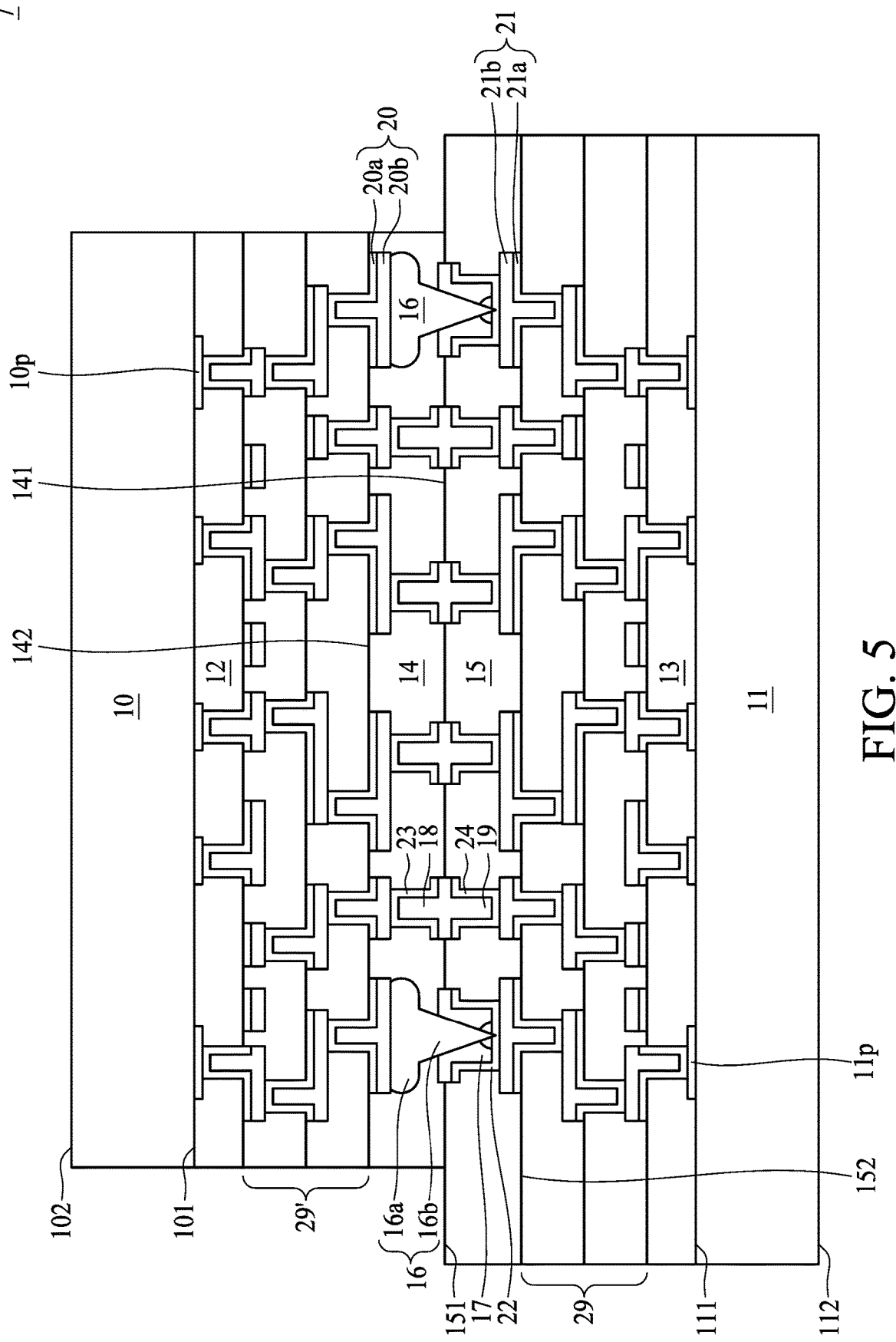
FIG. 5 illustrates a cross-sectional view of a semiconductor device package in accordance with some embodiments of the present disclosure.

FIG. 5 illustrates a cross-sectional view of a semiconductor device package 7 in accordance with some embodiments of the present disclosure. The semiconductor device package 7 in FIG. 5 is similar to the semiconductor device package 1 in FIG. 1A, except that the semiconductor device package 7 in FIG. 5 further includes dielectric layers 29 and 29'. The dielectric layers 29 and 29' may be disposed between the substrates 10 and 11. The dielectric layers 29 and 29' may include conductive structures (such as RDLs and vias) disposed therein. In some embodiments, the dielectric layers 29 and 29' include substantially the same materials as the dielectric layers 12 and 13. In some embodiments, there may be any number of dielectric layers in the first and second semiconductor structure depending on design specifications.

Figure 6A:
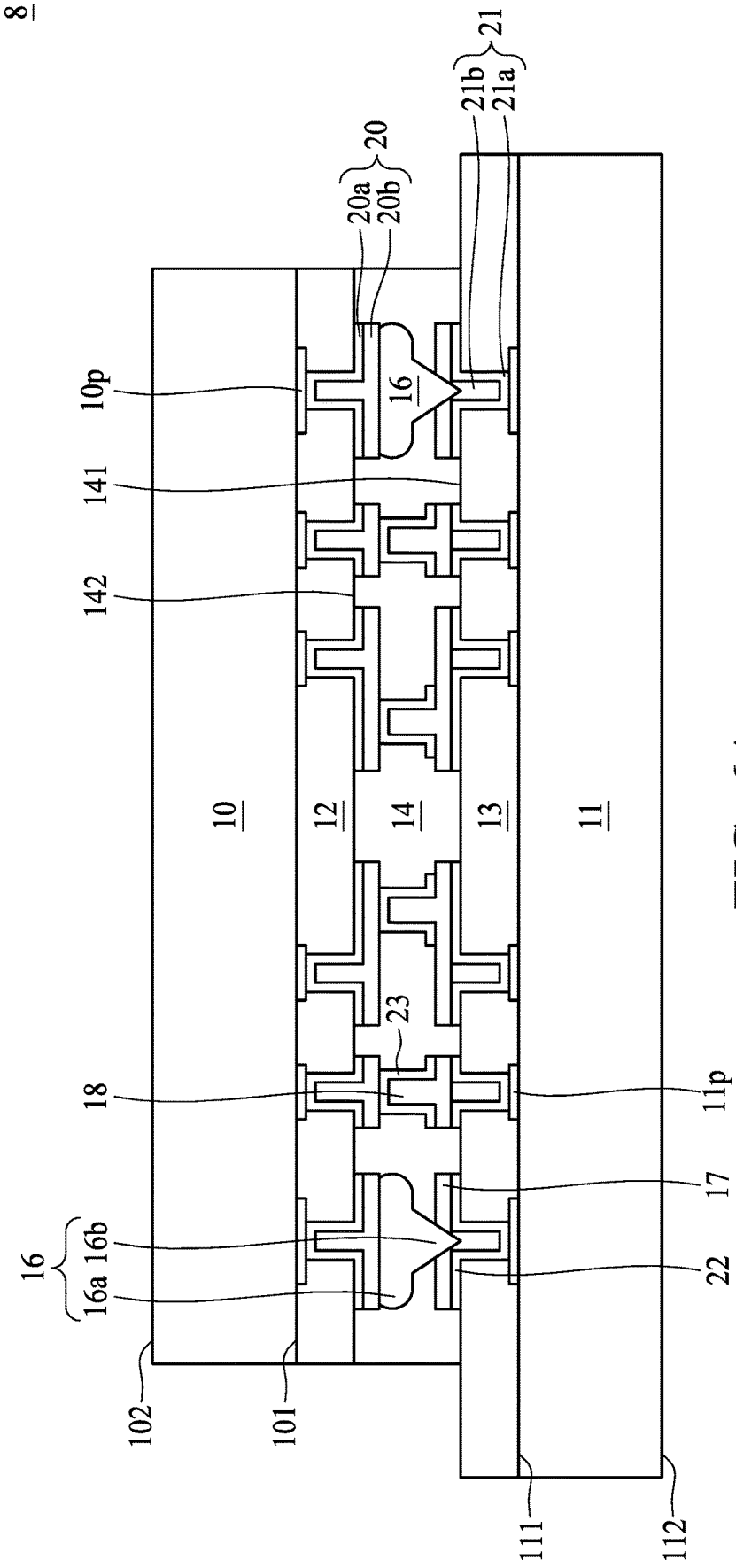
FIG. 6A illustrates a cross-sectional view of a semiconductor device package in accordance with some embodiments of the present disclosure.

FIG. 6A illustrates a cross-sectional view of a semiconductor device package 8 in accordance with some embodiments of the present disclosure. The semiconductor device package 8 of FIG. 6A is similar to the semiconductor device package 1 in FIG. 1A, except that the semiconductor device package 8 includes a via-to-pad connection between the first semiconductor structure and the second semiconductor structure. The conductive layer 22 and the electrical contact 17 on the substrate 11 form one or more pads. In some embodiments, as shown in FIG. 6A, the dielectric layer 15 is omitted.

Figure 6B:
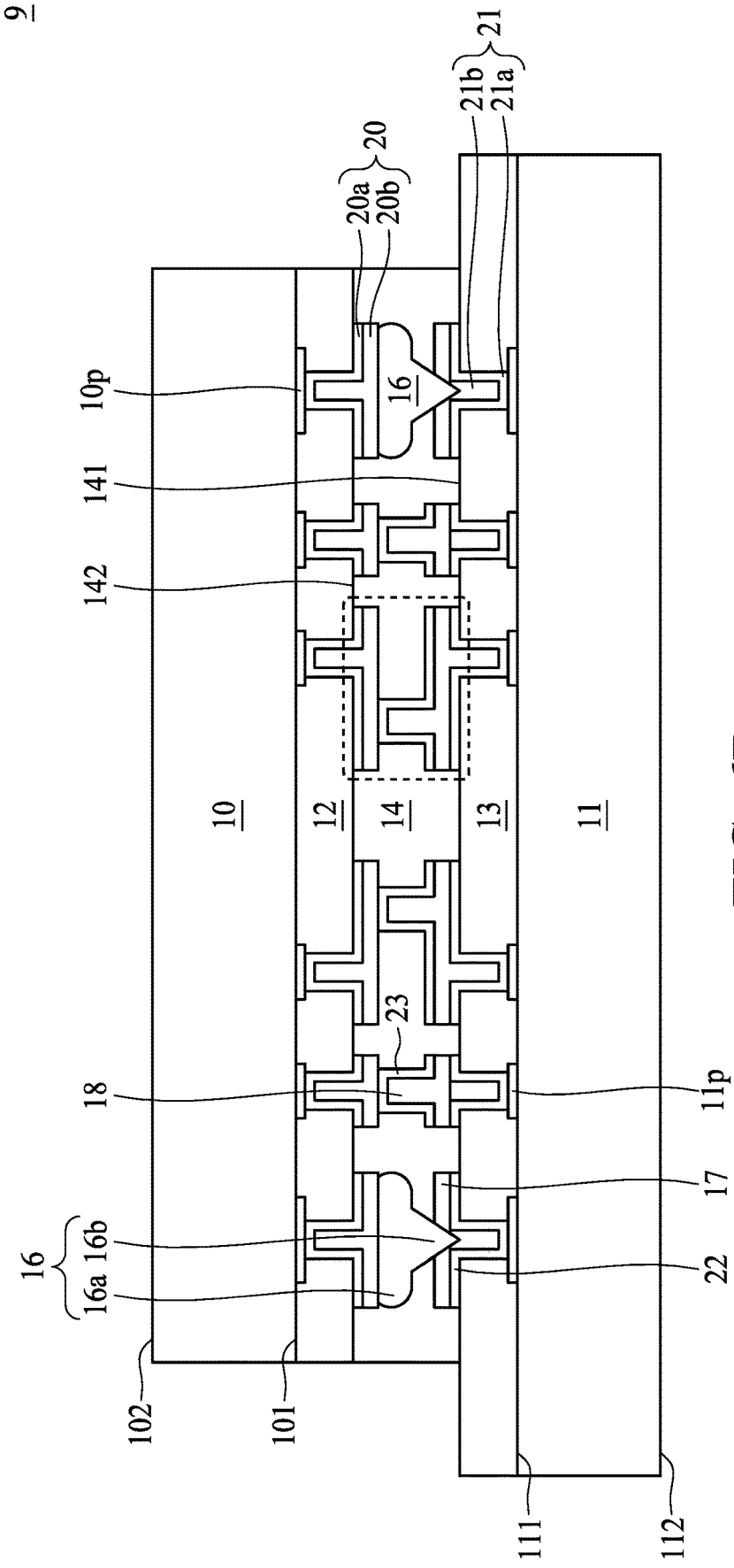
FIG. 6B illustrates a cross-sectional view of a semiconductor device package in accordance with some embodiments of the present disclosure.

FIG. 6B illustrates a cross-sectional view of a semiconductor device package 9 in accordance with some embodiments of the present disclosure. The semiconductor device package 9 of FIG. 6B is similar to the semiconductor device package 8 in FIG. 6A, except that the semiconductor device package 9 includes a pad-to-pad connection between the first semiconductor structure and the second semiconductor structure. The conductive layer 23 and the electrical contact 18 form one or more contact pads as indicated by a dotted box.

In some embodiments, in addition to the embodiments shown in FIG. 6A and FIG. 6B, the configurations of the connections between the first semiconductor structure and the second semiconductor structure may be designed depending on design specifications, and the present disclosure is not limited thereto.

FIG. 7A, FIG. 7B, FIG. 7C, FIG. 7D, FIG. 7E, FIG. 7F, FIG. 7G, and FIG. 7H are cross-sectional views of a semiconductor structure at various stages of fabrication, in accordance with some embodiments of the present disclosure. At least some of these figures have been simplified for a better understanding of the aspects of the present disclosure.

Figure 7A:
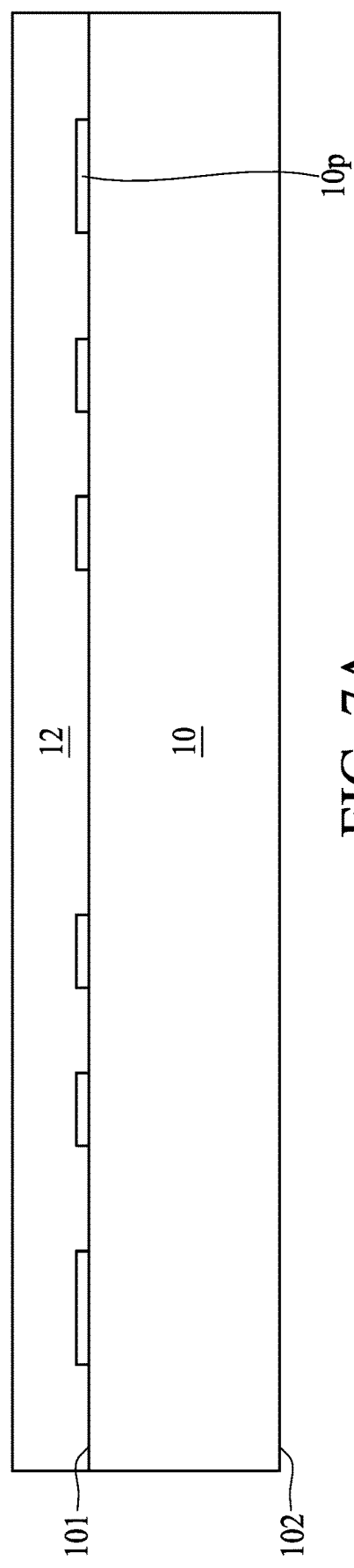
FIG. 7A illustrates one or more stages of a method of manufacturing a semiconductor device package in accordance with some embodiments of the present disclosure.

Referring to FIG. 7A, a substrate 10 is provided. The substrate 10 has a surface 101 and a surface 102 opposite to the surface 101. Conductive pads 10*p* are on the surface 101. A dielectric layer 12 is deposited on the surface 101 of the substrate 10. In some embodiments, the dielectric layer 12 is formed by, for example, coating, lamination or other suitable processes.

Referring to FIG. 7B, a photoresist film 30 (or a mask) is formed on the dielectric layer 12 by, for example, coating.

Figure 7C:
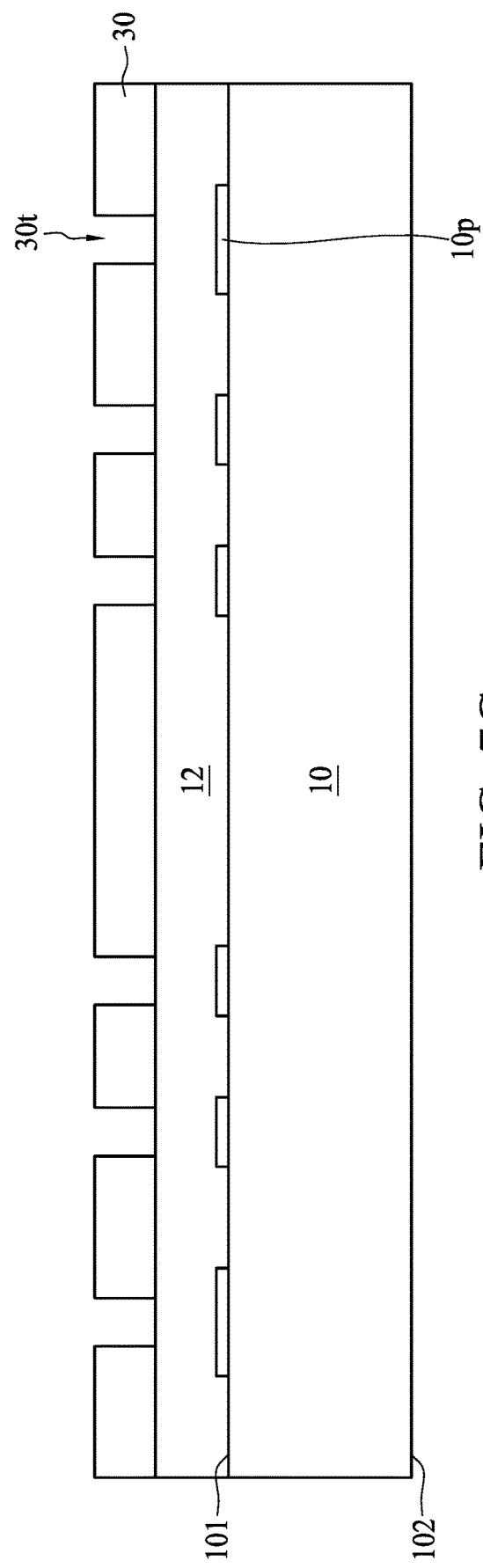
FIG. 7C illustrates one or more stages of a method of manufacturing a semiconductor device package in accordance with some embodiments of the present disclosure.

Referring to FIG. 7C, one or more openings (or trenches) 30*t* are formed in the photoresist film 30 by, for example, lithographic technique, to expose a portion of the dielectric layer 12.

Figure 7D:
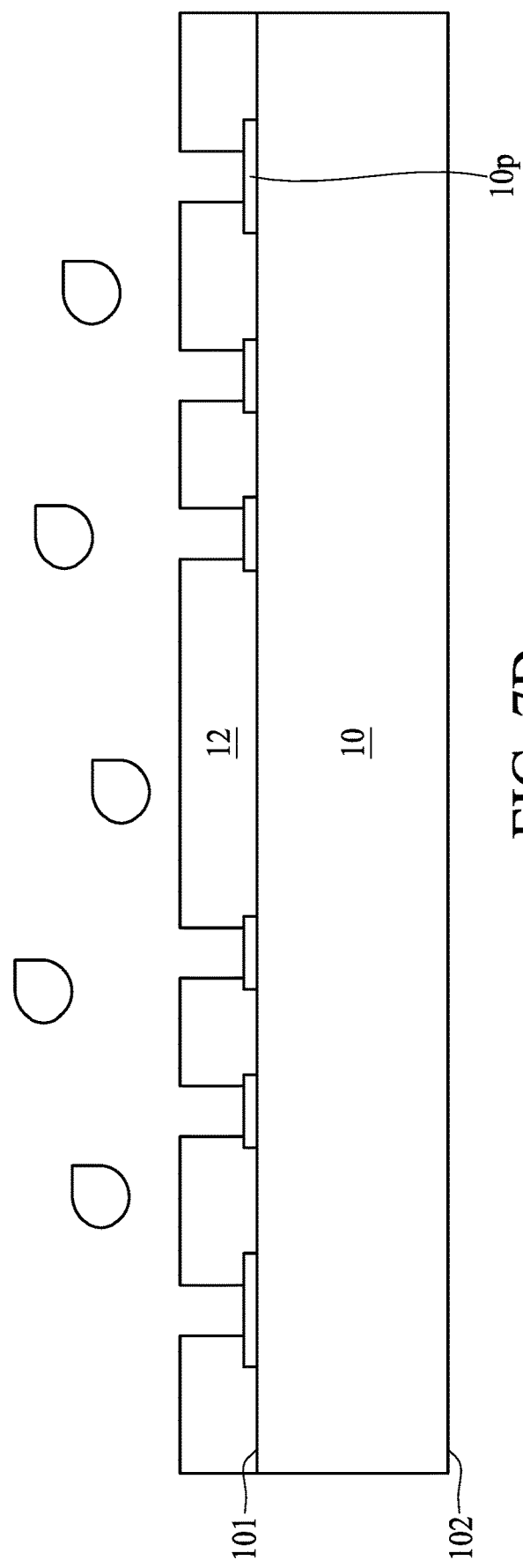
FIG. 7D illustrates one or more stages of a method of manufacturing a semiconductor device package in accordance with some embodiments of the present disclosure.

Referring to FIG. 7D, the dielectric layer 12 is etched through the openings 30*t* to expose the conductive pads 10*p* on the substrate 10. Then, the photoresist film 30 is removed by etching, stripping, or other suitable processes.

Figure 7E:
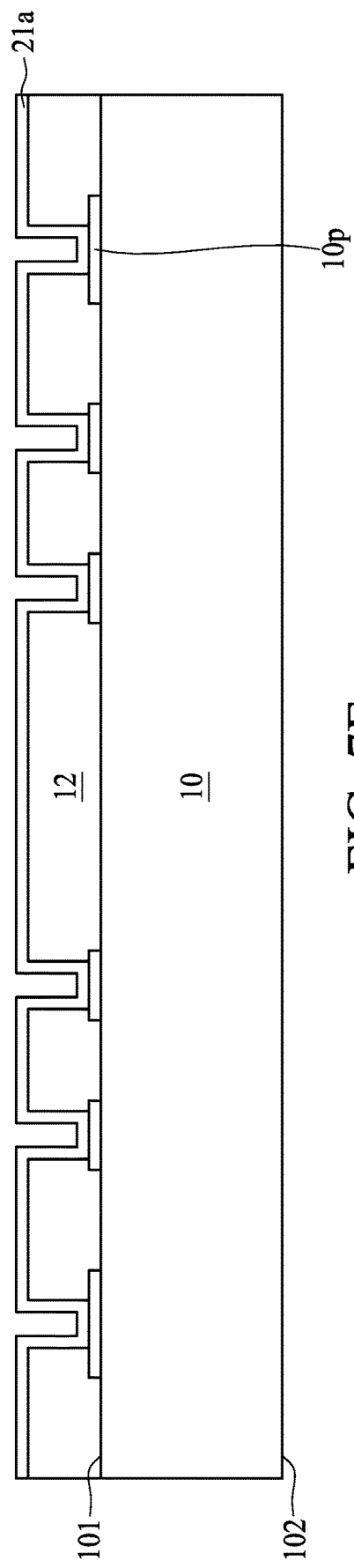
FIG. 7E illustrates one or more stages of a method of manufacturing a semiconductor device package in accordance with some embodiments of the present disclosure.

Referring to FIG. 7E, a seed layer 21*a* is deposited on sidewalls and bottom surfaces of the openings 30*t*. In some embodiments, the seed layer 21*a* is formed by, for example, sputtering titanium and copper (Ti/Cu) or a TiW. In some embodiments, the seed layer 19*a* may be formed by electroless plating Ni or Cu.

Figure 7F:
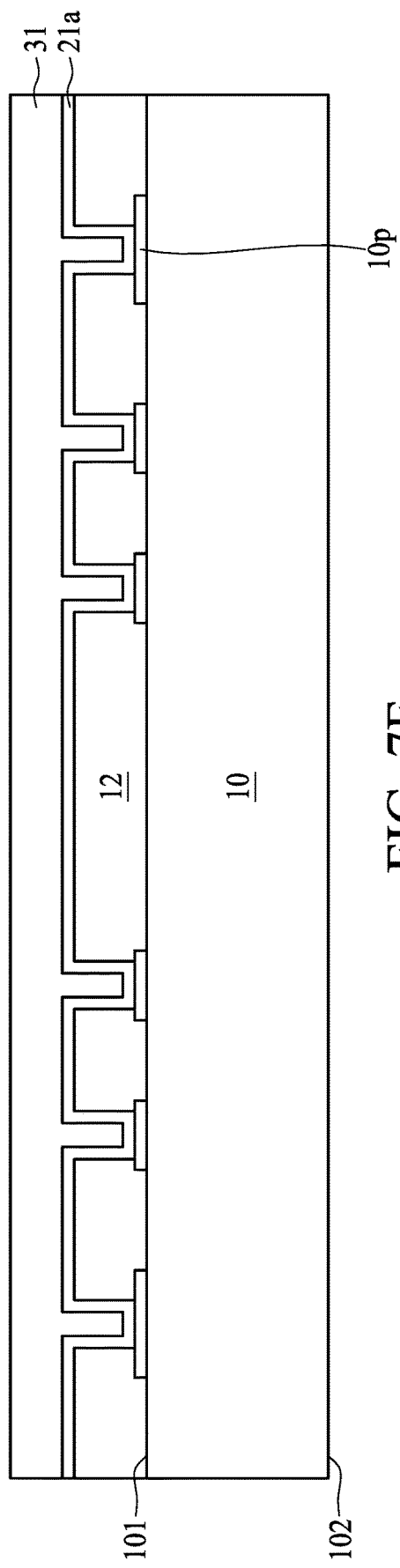
FIG. 7F illustrates one or more stages of a method of manufacturing a semiconductor device package in accordance with some embodiments of the present disclosure.

Referring to FIG. 7F, a photoresist film 31 is formed on the seed layer 21*a* by, for example, coating.

Figure 7G:
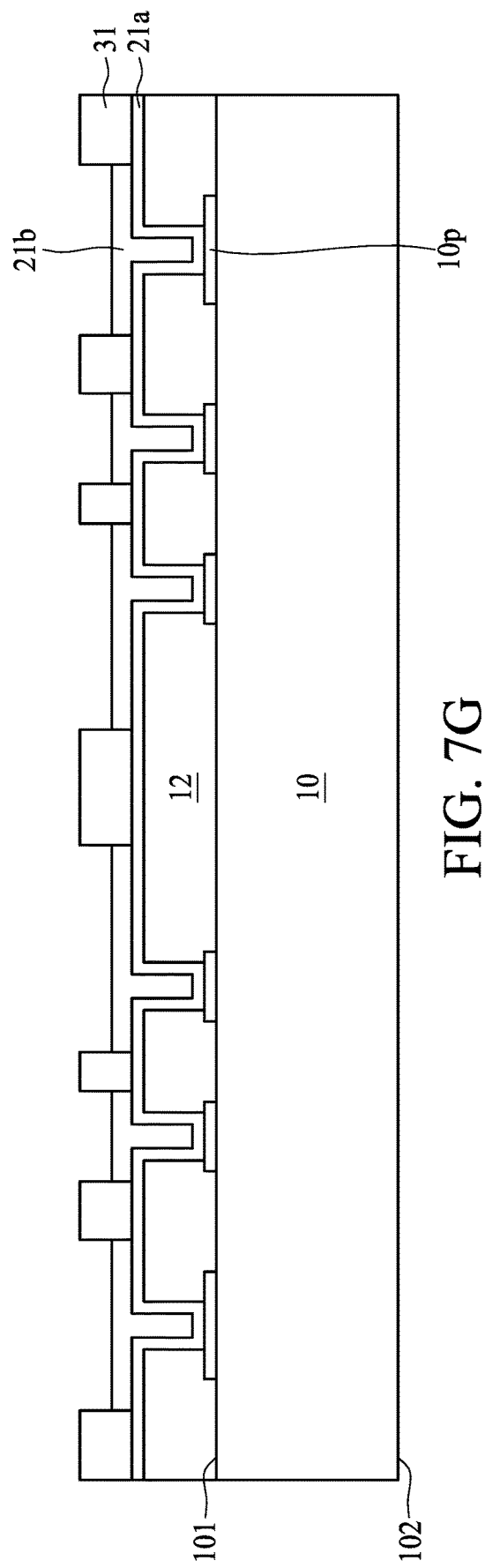
FIG. 7G illustrates one or more stages of a method of manufacturing a semiconductor device package in accordance with some embodiments of the present disclosure.

Referring to FIG. 7G, one or more openings are formed in the photoresist film 31 by, for example, lithographic technique, to expose a portion of the seed layer 21*a*. Then, a metal layer 21*b* is formed on the exposed portion of the seed layer 21*a* by plating Cu, Ag, Ni, Au, or another metal. In some embodiments, the metal layer 21*b* may be formed by electroless plating Cu, Ni, Pb, or another metal. In some embodiments, the metal layer 21*b* may be formed by printing Cu, Ag, Au, or another metal.

Figure 7H:
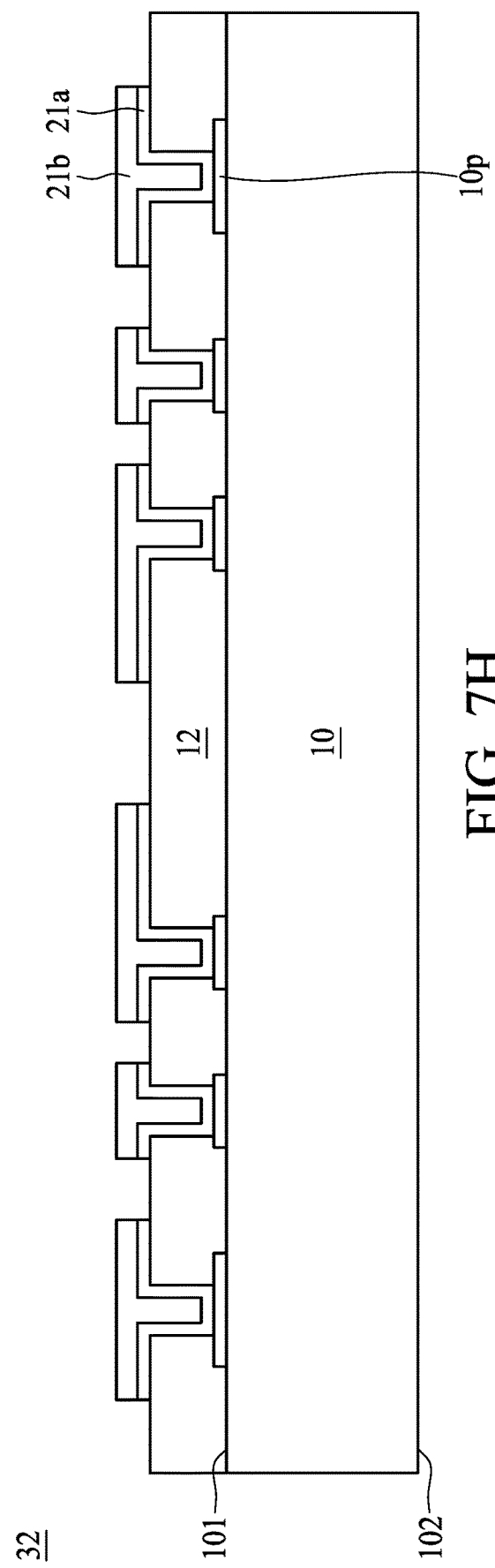
FIG. 7H illustrates one or more stages of a method of manufacturing a semiconductor device package in accordance with some embodiments of the present disclosure.

Referring to FIG. 7H, the photoresist film 31 and the seed layer 21*a* covered by the photoresist film 31 are removed by etching or other suitable processes. The semiconductor structure 32 is formed through the operations as shown in FIG. 7A, FIG. 7B, FIG. 7C, FIG. 7D, FIG. 7E, FIG. 7F, FIG. 7G, and FIG. 7H. The semiconductor structure 32 can be used to form the first semiconductor structure and the second semiconductor structure as illustrated in FIG. 1A.

FIG. 8A, FIG. 8B, FIG. 8C, FIG. 8D, FIG. 8E, FIG. 8F, and FIG. 8G are cross-sectional views of the first semiconductor structure at various stages of fabrication, in accordance with some embodiments of the present disclosure. At least some of these figures have been simplified for a better understanding of the aspects of the present disclosure.

Figure 8A:
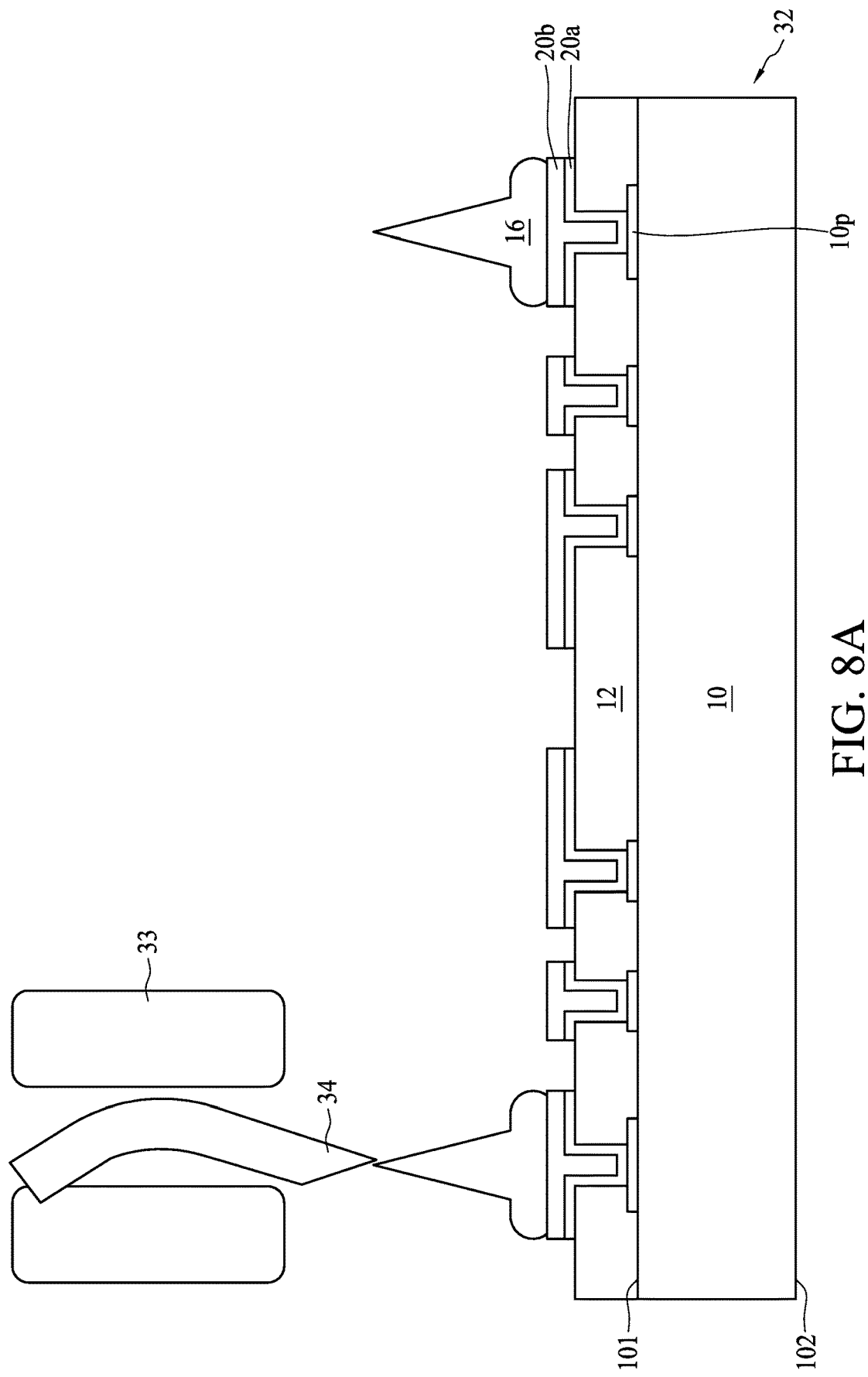
FIG. 8A illustrates one or more stages of a method of manufacturing a semiconductor device package in accordance with some embodiments of the present disclosure.

Referring to FIG. 8A, a semiconductor structure, such as the semiconductor structure 32, is provided. An electrical contact 16 is formed on the surface 101 of the substrate 10 through a forming or drawing process, such as a wire drawing. In some embodiments, for examples, the electrical contact 16 may be formed by forming or drawing a metal wire 34 with a capillary device 33. In some embodiments, the electrical contact 16 is pulled or drawn to form a tip with an increased mechanical property.

In some embodiments, the electrical contact 16 may undergo a heat treatment, such as an annealing operation or a sintering operation, before, during, or after the forming or drawing process.

Figure 8B:
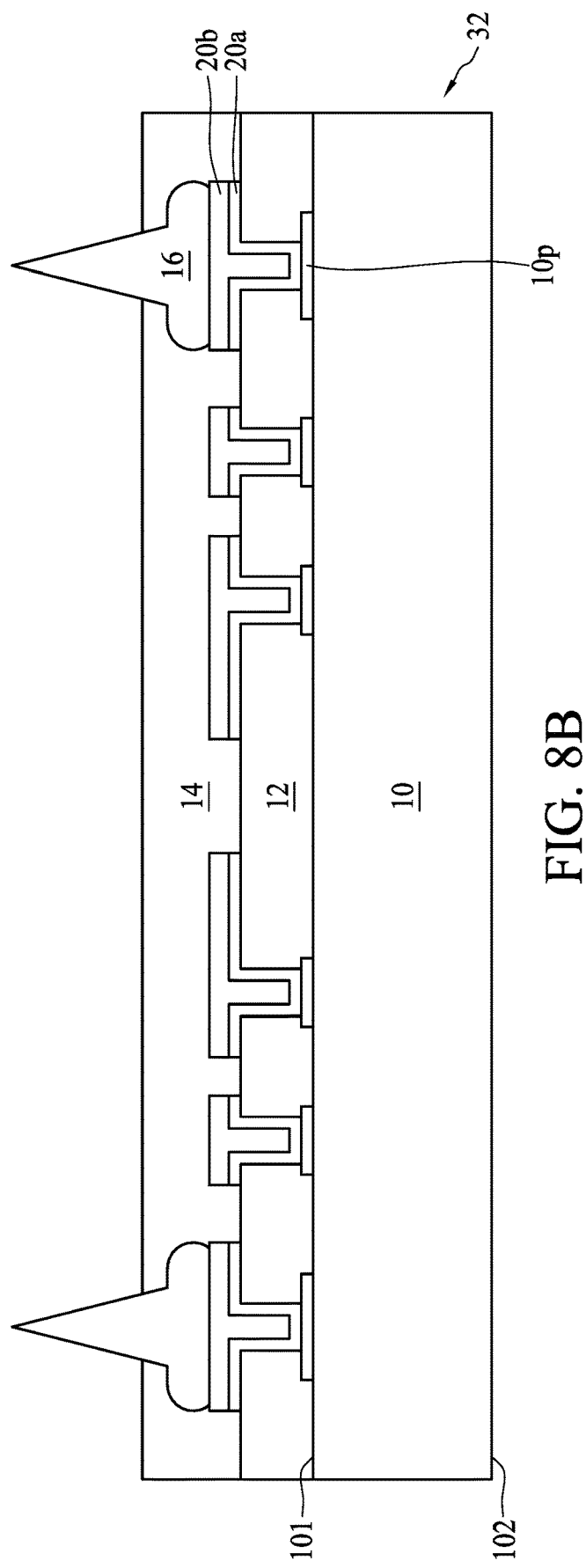
FIG. 8B illustrates one or more stages of a method of manufacturing a semiconductor device package in accordance with some embodiments of the present disclosure.

Referring to FIG. 8B, a dielectric layer 14 is disposed on the surface 101 by, for example, coating, lamination or other suitable processes.

Figure 8C:
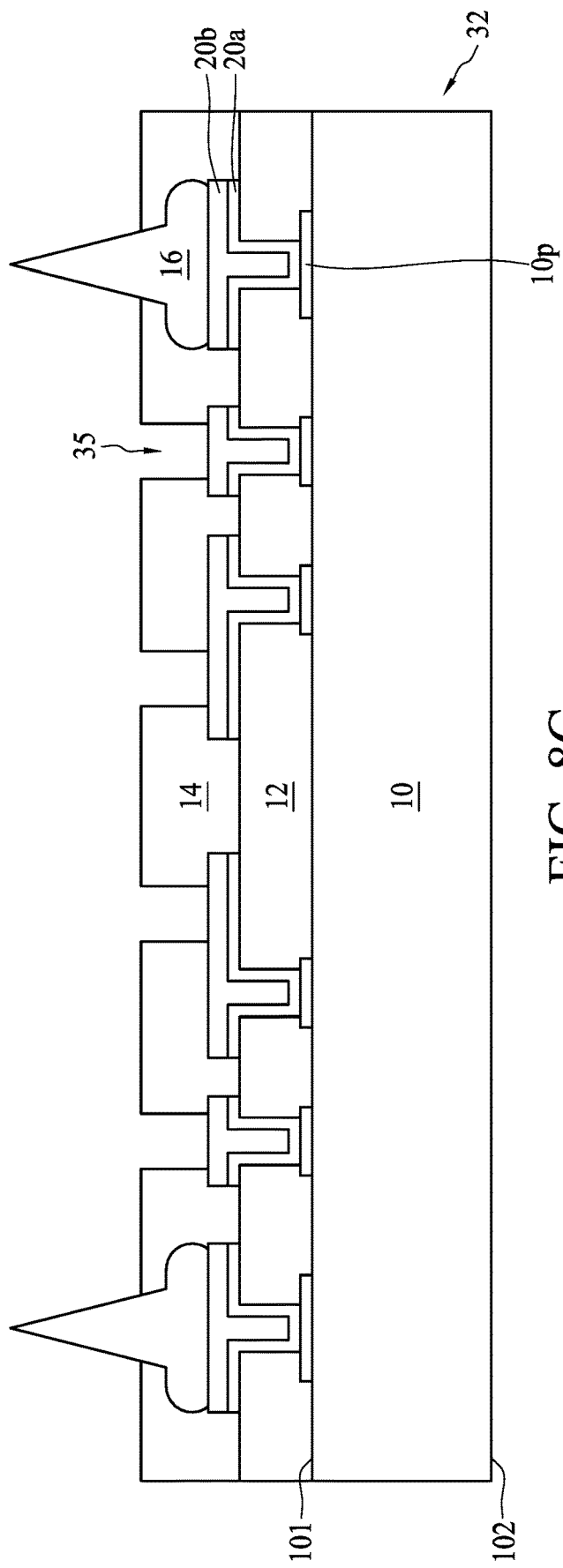
FIG. 8C illustrates one or more stages of a method of manufacturing a semiconductor device package in accordance with some embodiments of the present disclosure.

Referring to FIG. 8C, one or more openings 35 are formed in the dielectric layer 14 by, for example, lithographic technique, to expose a portion of the metal layer 20*b*.

Figure 8D:
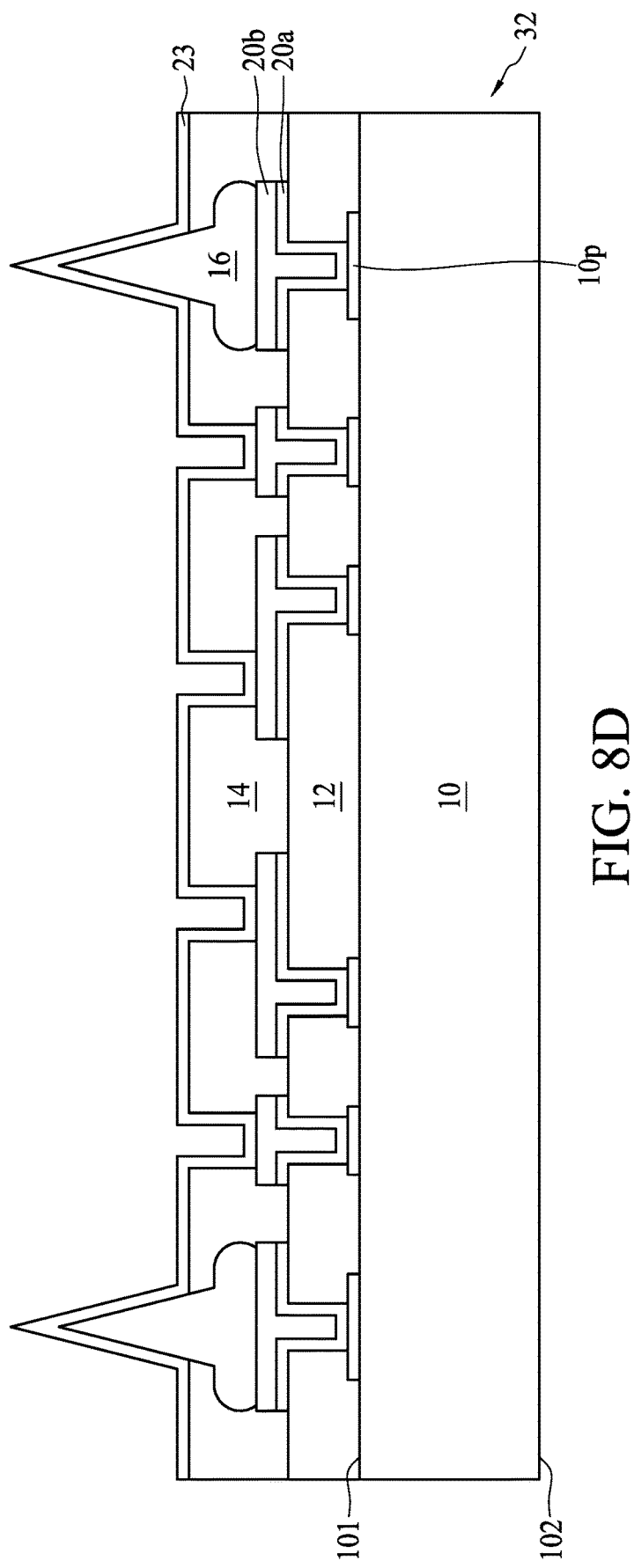
FIG. 8D illustrates one or more stages of a method of manufacturing a semiconductor device package in accordance with some embodiments of the present disclosure.

Referring to FIG. 8D, a conductive layer 23 is formed on the exposed portion of the metal layer 20b by, for example, plating. The conductive layer 23 is also formed the exposed portions of the electrical contact 16 and the dielectric layer 14.

Figure 8E:
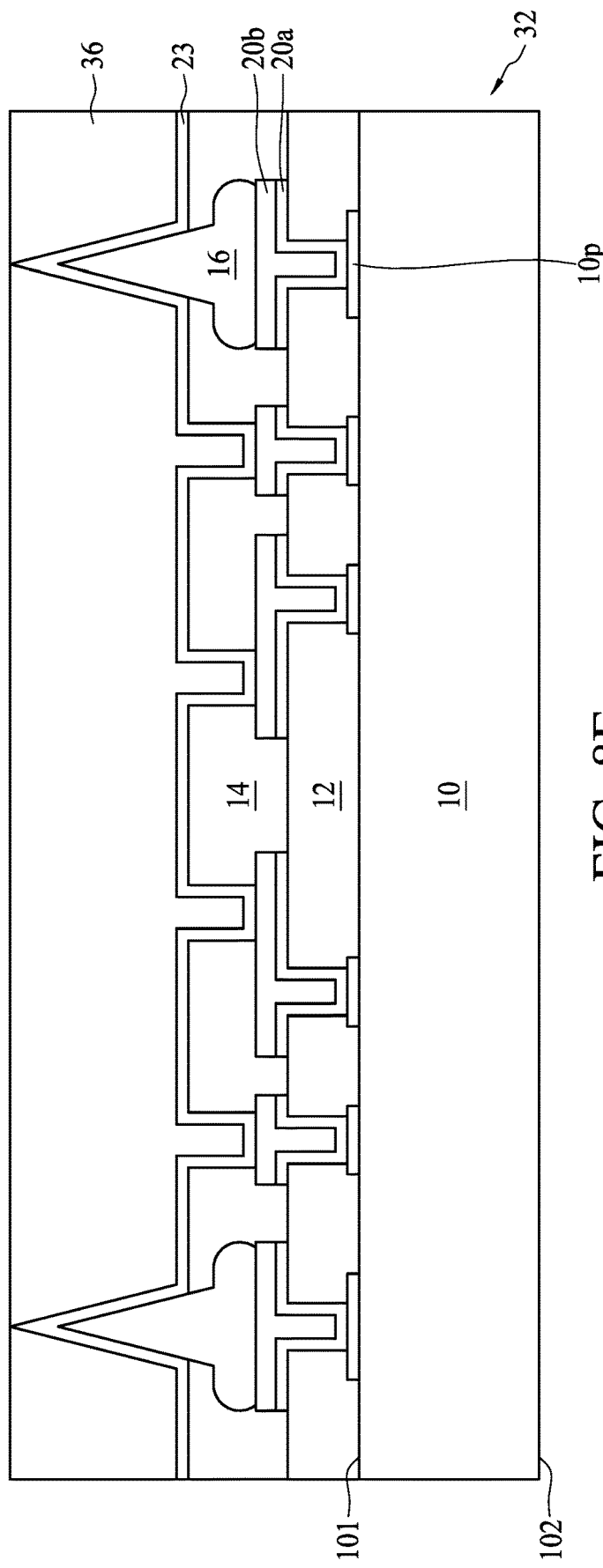
FIG. 8E illustrates one or more stages of a method of manufacturing a semiconductor device package in accordance with some embodiments of the present disclosure.

Referring to FIG. 8E, a photoresist film 36 is formed on the conductive layer 23 by, for example, coating.

Figure 8F:
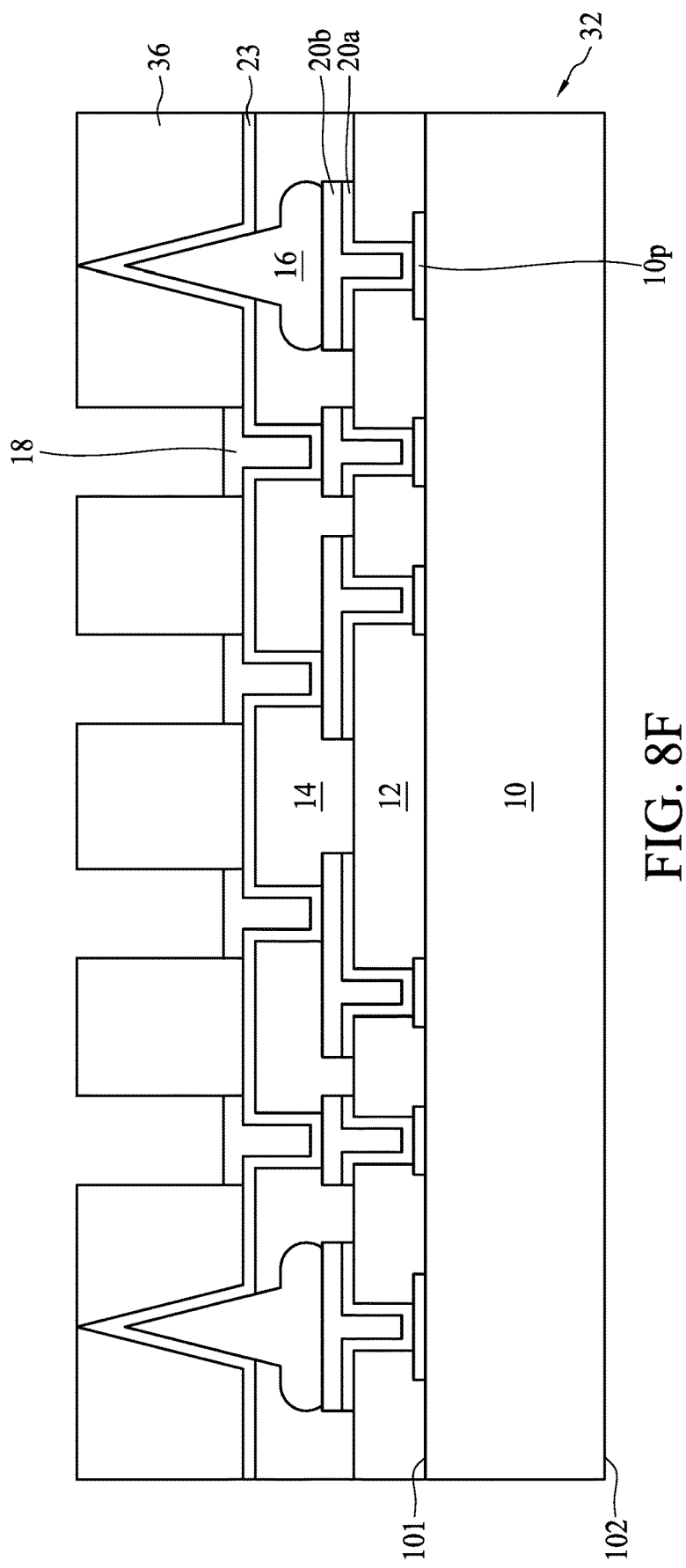
FIG. 8F illustrates one or more stages of a method of manufacturing a semiconductor device package in accordance with some embodiments of the present disclosure.

Referring to FIG. 8F, one or more openings are formed in the photoresist film 36 by, for example, lithographic technique, to expose a portion of the conductive layer 23. Then, an electrical contact 18 is filled within the openings, and is disposed on the exposed conductive layer 23.

In some embodiments, the electrical contact 18 is formed by, for example, PVD, sputtering, electroless plating, or other suitable operations.

Figure 8G:
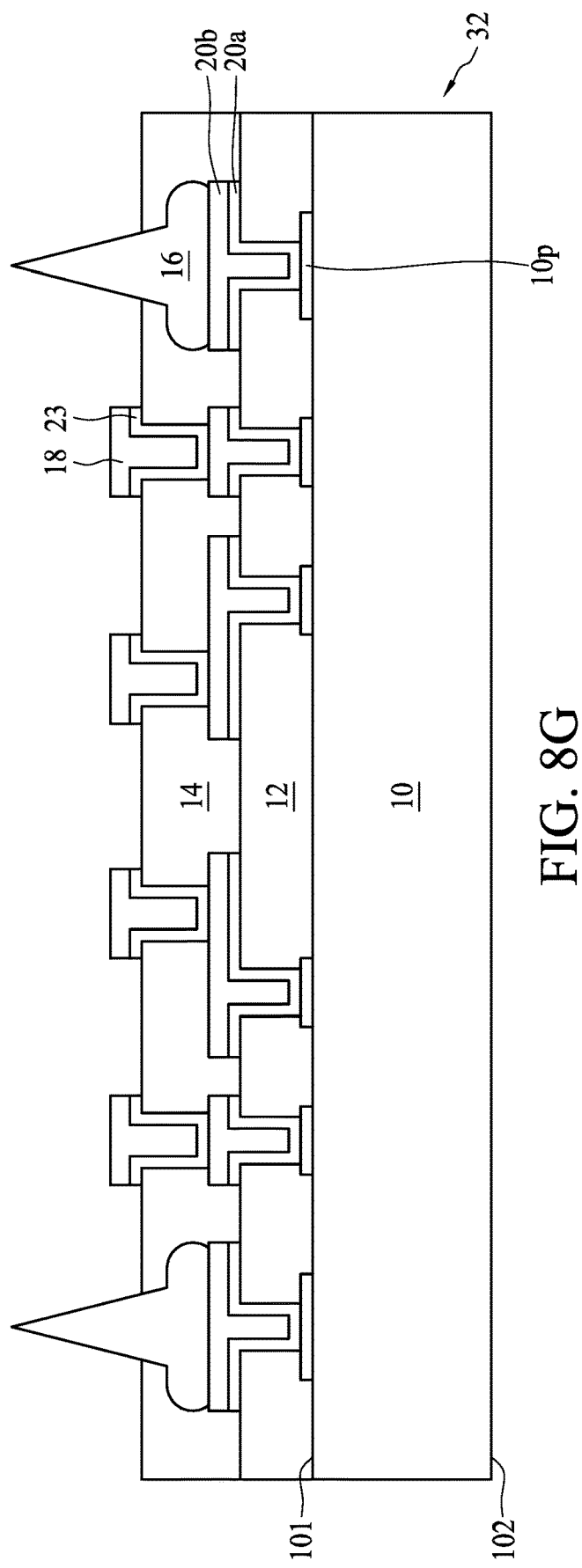
FIG. 8G illustrates one or more stages of a method of manufacturing a semiconductor device package in accordance with some embodiments of the present disclosure.

Referring to FIG. 8G, the photoresist film 36 and a portion of the conductive layer 23 that is covered by the photoresist film 36 are removed by etching or other suitable processes. The semiconductor structure obtained in the operation shown in FIG. 8G is referred to as the first semiconductor structure.

FIG. 9A, FIG. 9B, FIG. 9C, FIG. 9D, FIG. 9E, FIG. 9F, FIG. 9G, and FIG. 9H are cross-sectional views of the second semiconductor structure at various stages of fabrication, in accordance with some embodiments of the present disclosure. At least some of these figures have been simplified for a better understanding of the aspects of the present disclosure.

The operations illustrated in FIG. 9A to FIG. 9H are similar to those illustrated in FIG. 8A to FIG. 9G, except that the electrical contact 16 is not formed in the product obtained through the operation illustrated in FIG. 9A to FIG. 9H.

Figure 9A:
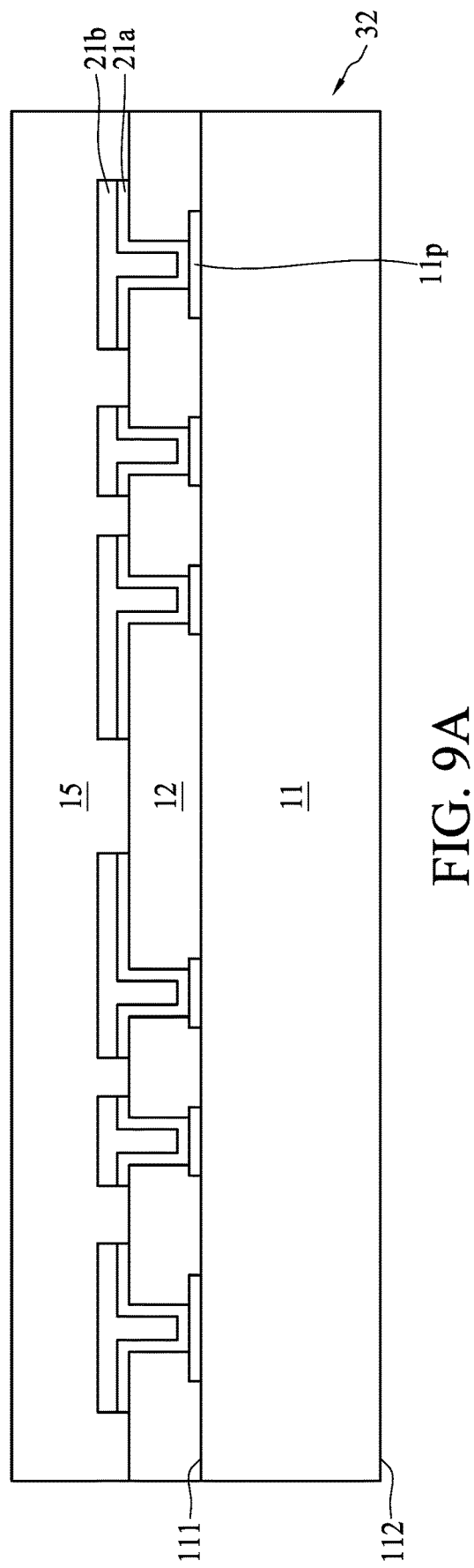
FIG. 9A illustrates one or more stages of a method of manufacturing a semiconductor device package in accordance with some embodiments of the present disclosure.
Figure 9B:
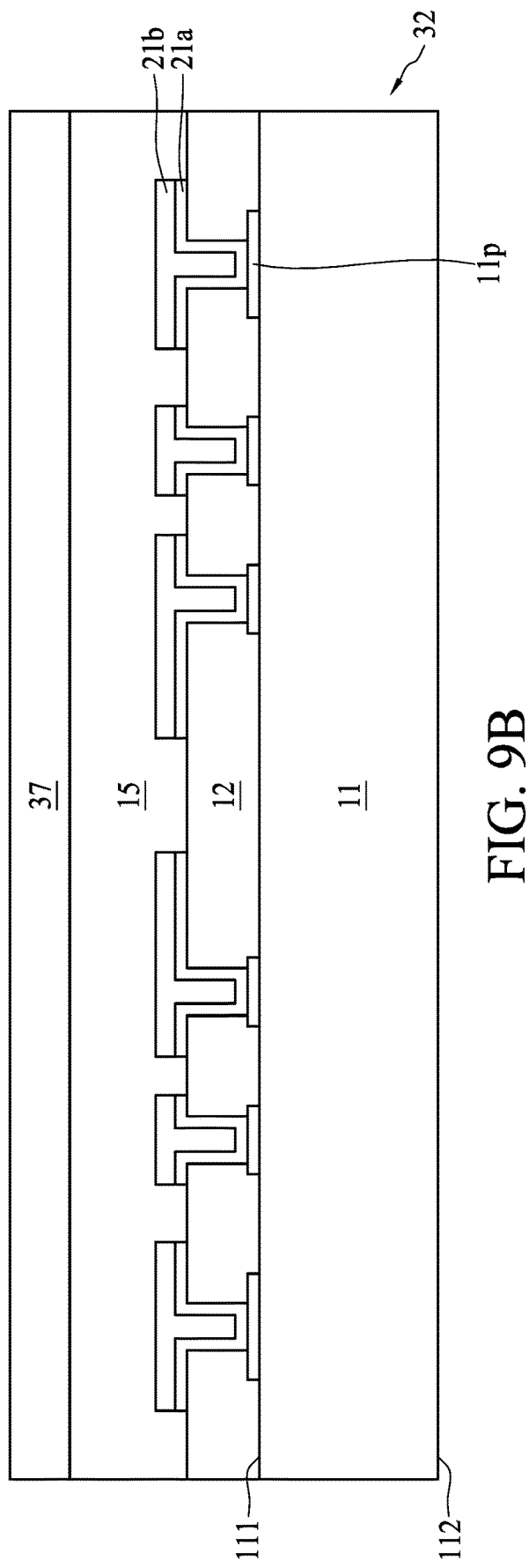
FIG. 9B illustrates one or more stages of a method of manufacturing a semiconductor device package in accordance with some embodiments of the present disclosure.

Referring to FIG. 9A, a semiconductor structure, such as the semiconductor structure 32, is provided. A dielectric layer 15 is disposed on the surface 111 of the substrate 11 to cover the metal layer 21b. Referring to FIG. 9B, a photoresist film 37 is formed on the dielectric layer 15.

Figure 9C:
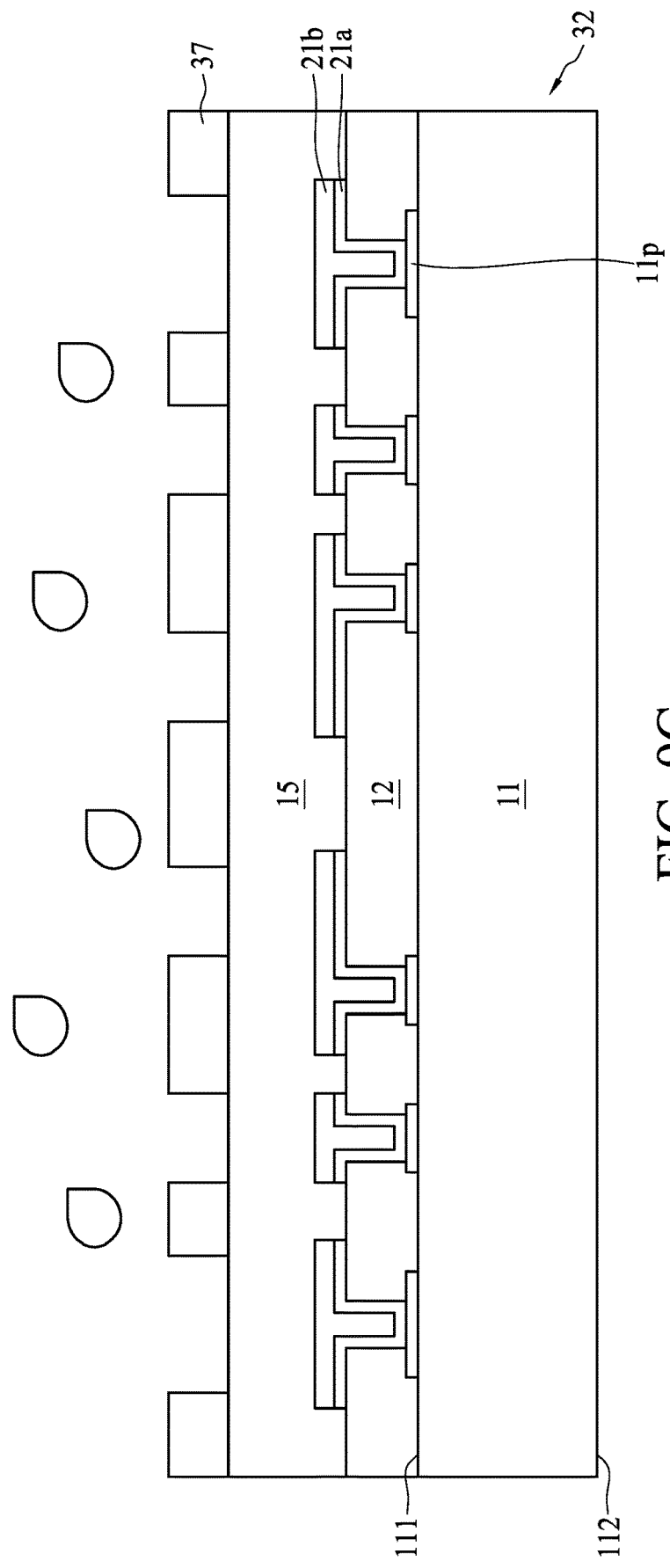
FIG. 9C illustrates one or more stages of a method of manufacturing a semiconductor device package in accordance with some embodiments of the present disclosure.

Referring to FIG. 9C, one or more openings are formed in the photoresist film 37 to expose a portion of the dielectric layer 15.

Figure 9D:
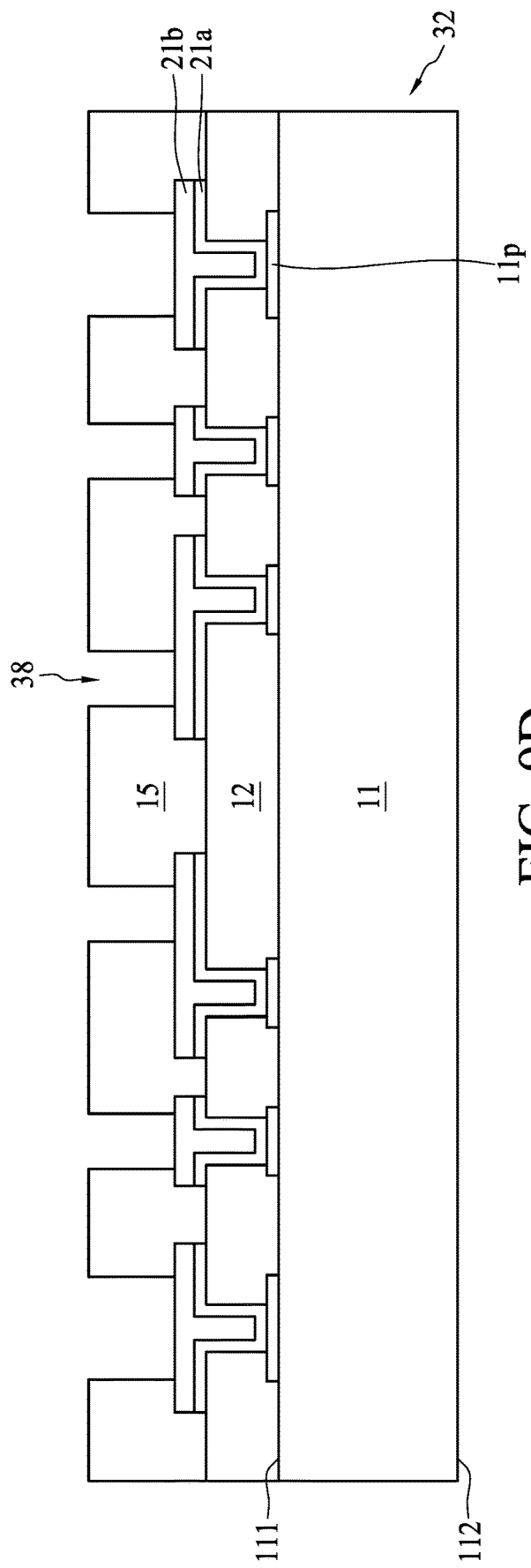
FIG. 9D illustrates one or more stages of a method of manufacturing a semiconductor device package in accordance with some embodiments of the present disclosure.

Referring to FIG. 9D, one or more openings 38 are formed in the dielectric layer 15 through the photoresist film 37 in FIG. 9C to expose a portion of the metal layer 21b.

Figure 9E:
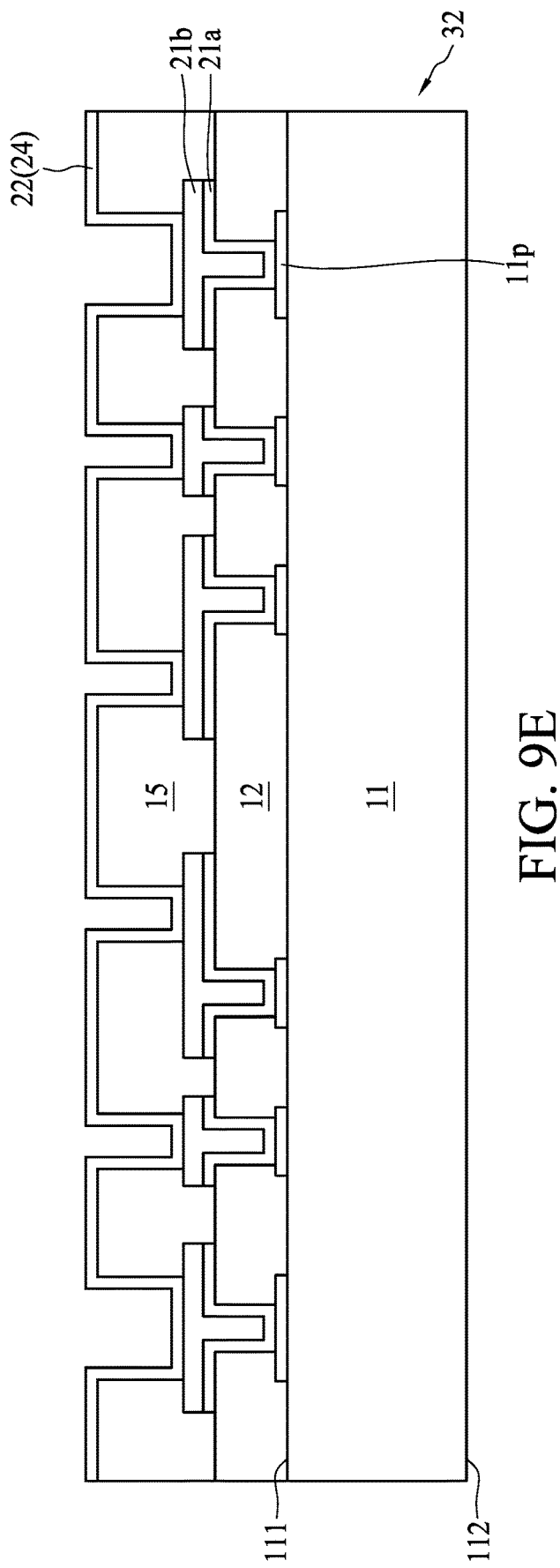
FIG. 9E illustrates one or more stages of a method of manufacturing a semiconductor device package in accordance with some embodiments of the present disclosure.

Referring to FIG. 9E, a conductive layer 22 is formed within the openings 38 in FIG. 9D, and is disposed on the exposed portion of the metal layer 21b.

Figure 9F:
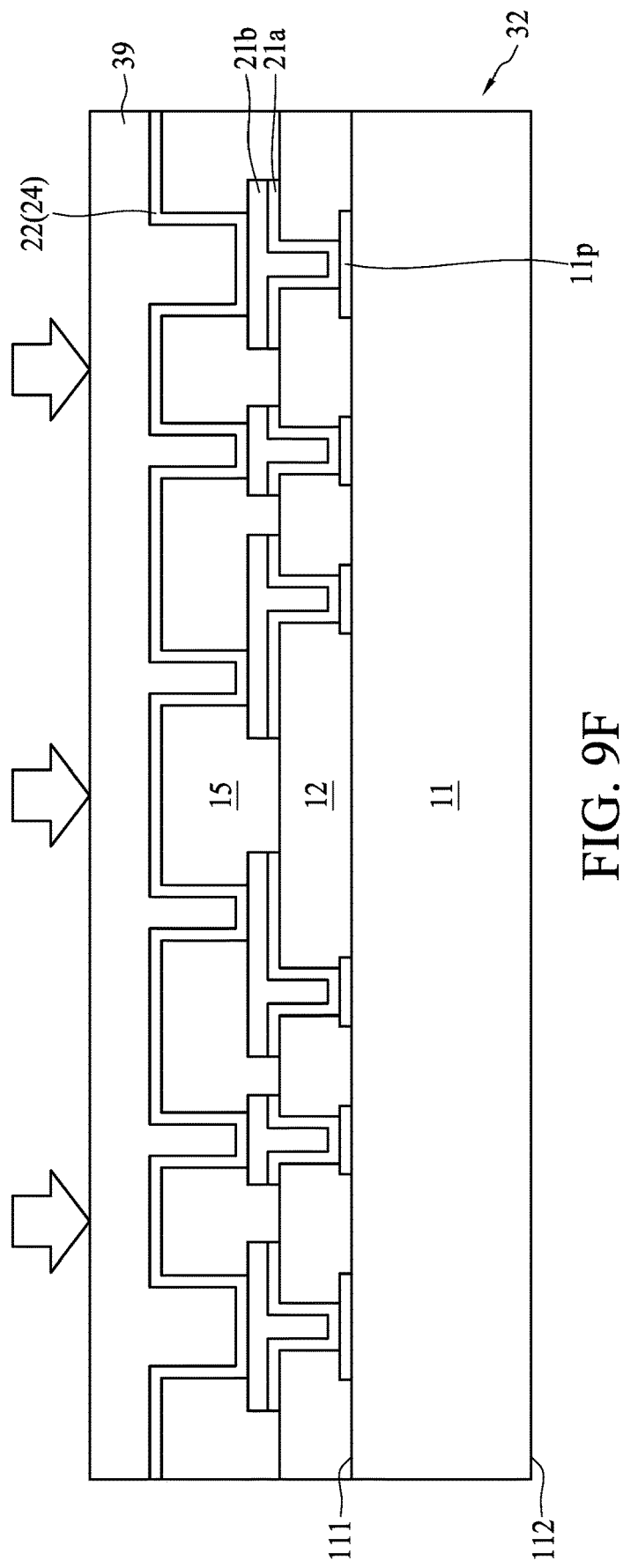
FIG. 9F illustrates one or more stages of a method of manufacturing a semiconductor device package in accordance with some embodiments of the present disclosure.

Referring to FIG. 9F, a photoresist film 39 is formed on the conductive layer 22.

Figure 9G:
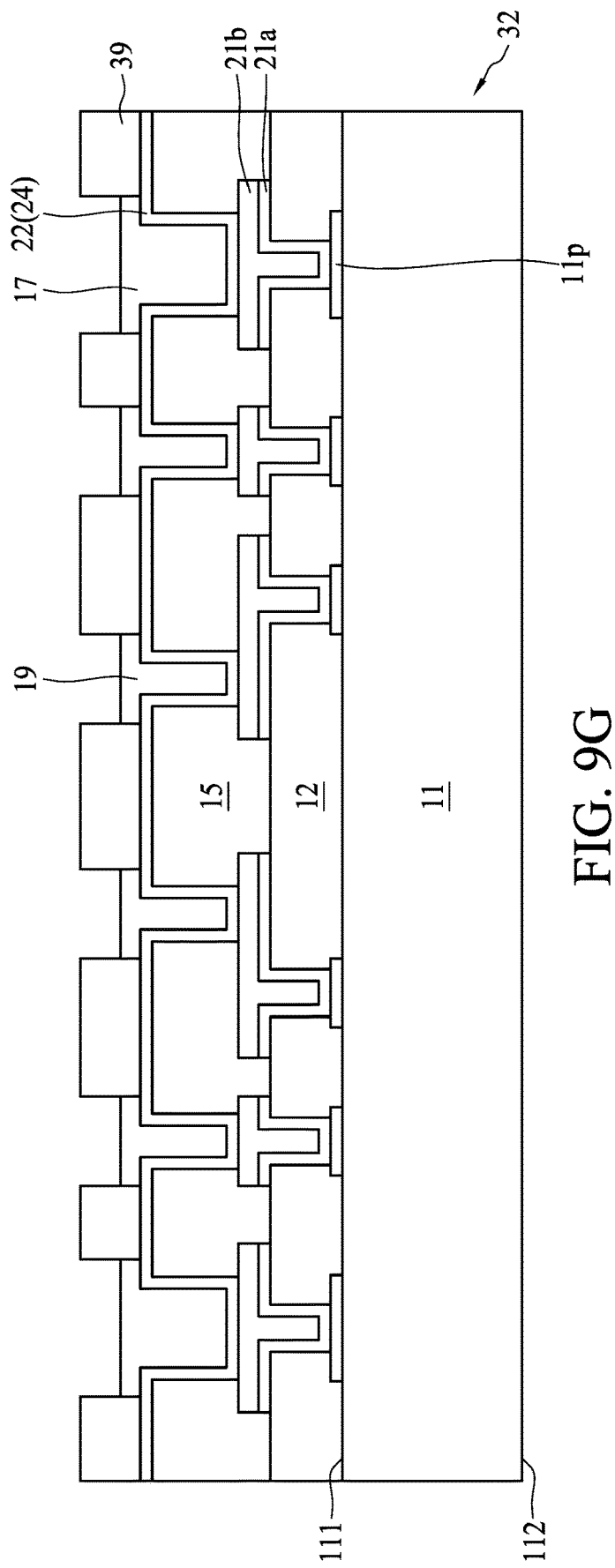
FIG. 9G illustrates one or more stages of a method of manufacturing a semiconductor device package in accordance with some embodiments of the present disclosure.

Referring to FIG. 9G, one or more openings are formed in the photoresist film 39 to expose a portion of the conductive layer 22. An electrical contact 17 and an electrical contact 19 are formed on the exposed conductive layer 22.

Figure 9H:
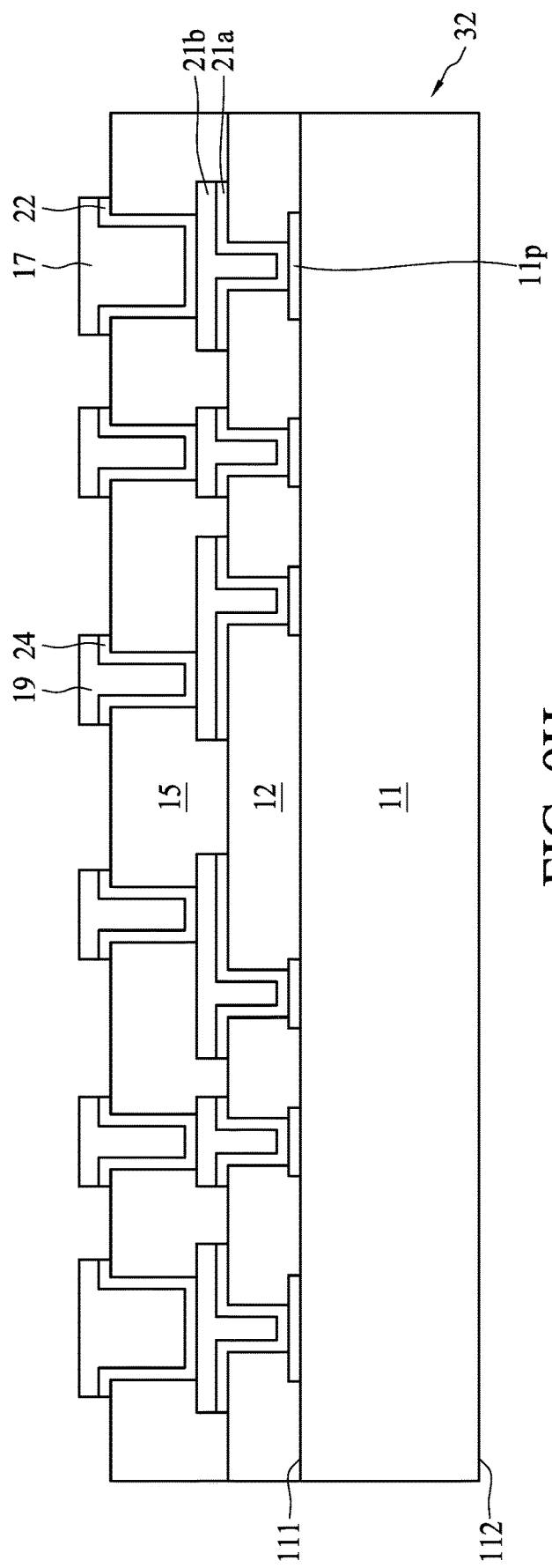
FIG. 9H illustrates one or more stages of a method of manufacturing a semiconductor device package in accordance with some embodiments of the present disclosure.

Referring to FIG. 9H, the photoresist film 39 a portion of the conductive layer 22 that is covered by the photoresist film 39 are removed, forming the remaining conductive layers 22 and 24. The semiconductor structure obtained in the operation shown in FIG. 9H is referred to as the second semiconductor structure.

Figure 10A:
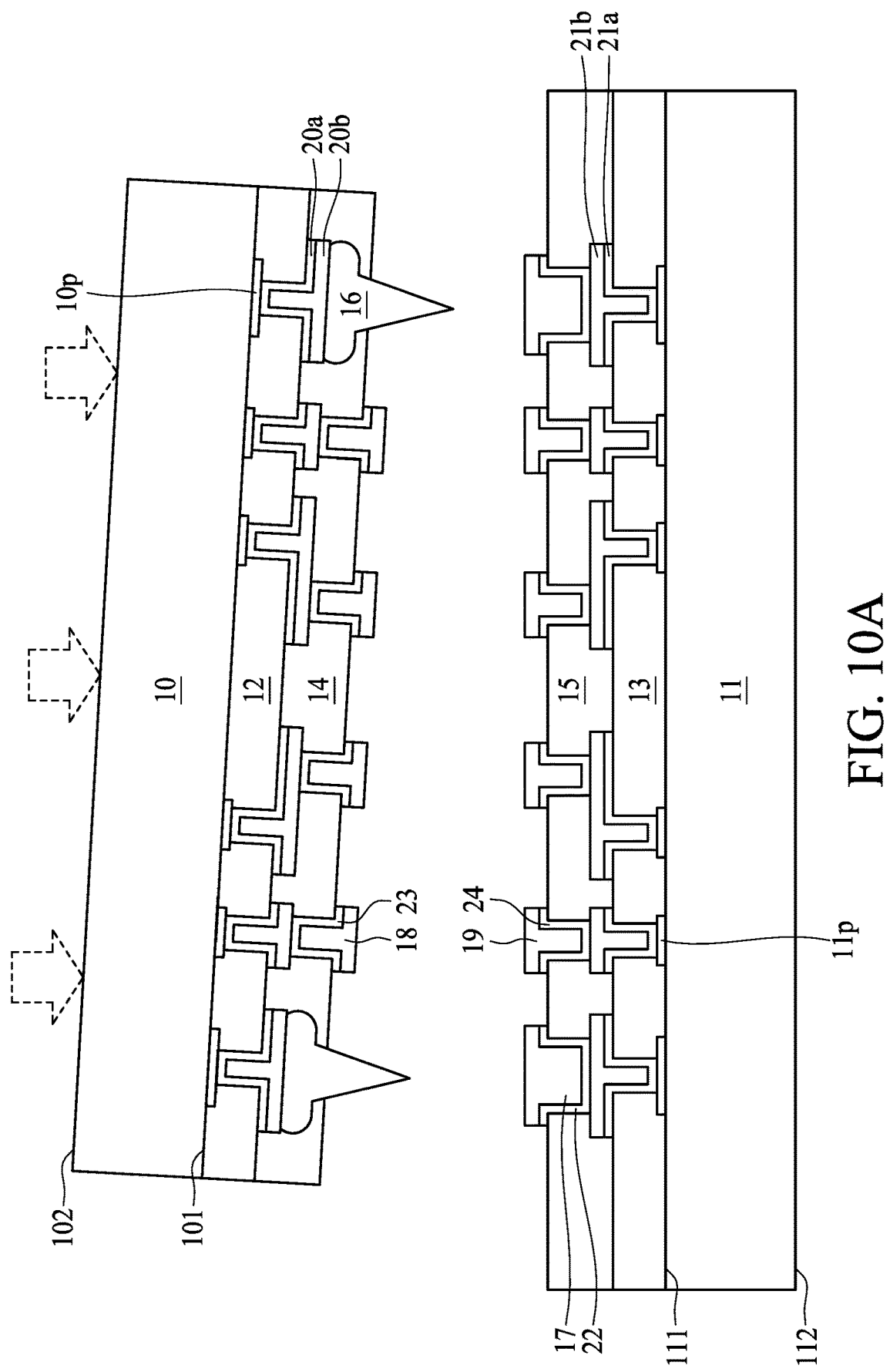
FIG. 10A illustrates one or more stages of a method of manufacturing a semiconductor device package in accordance with some embodiments of the present disclosure.
Figure 10B:
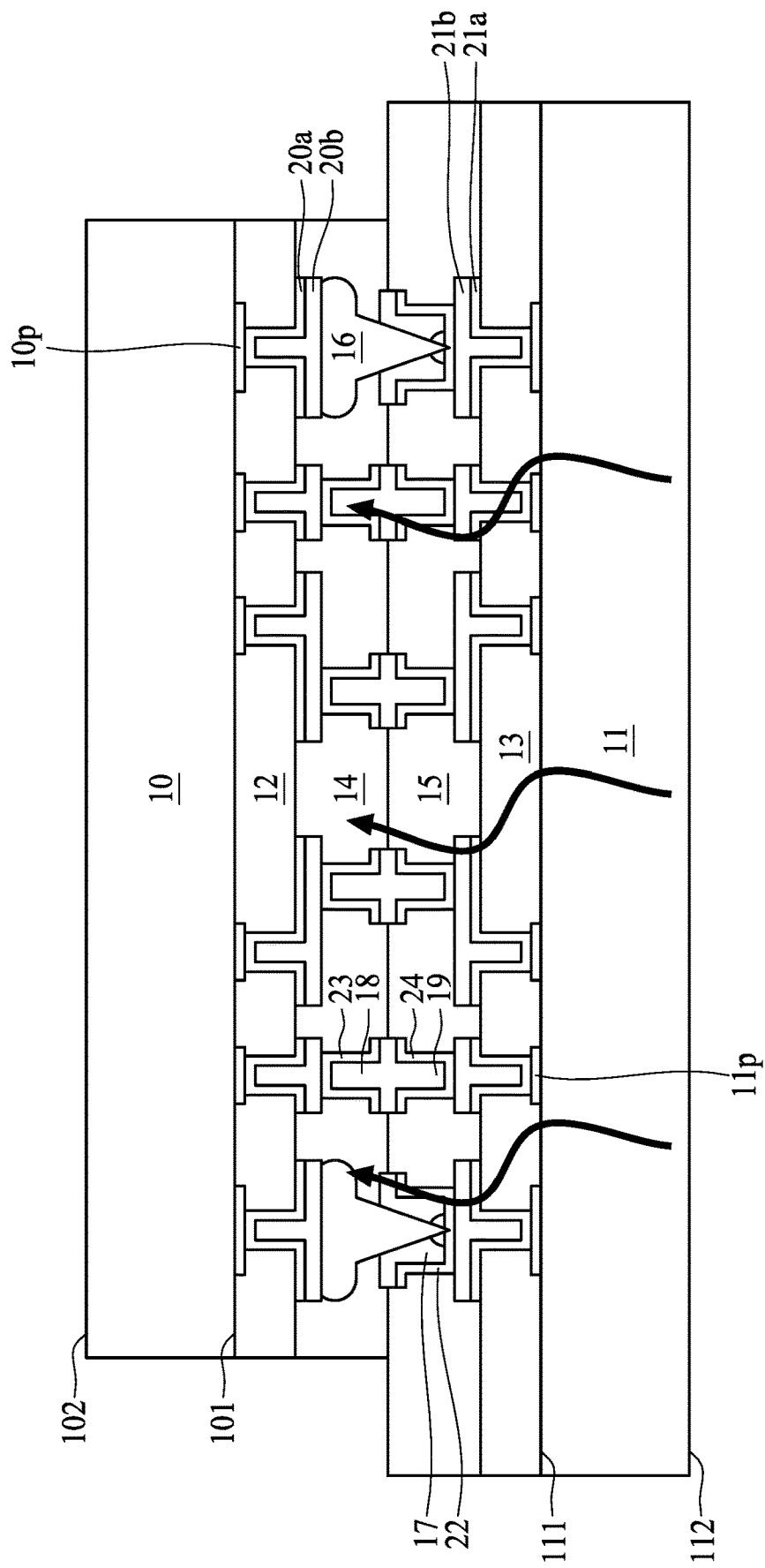
FIG. 10B illustrates one or more stages of a method of manufacturing a semiconductor device package in accordance with some embodiments of the present disclosure.
Figure 10C:
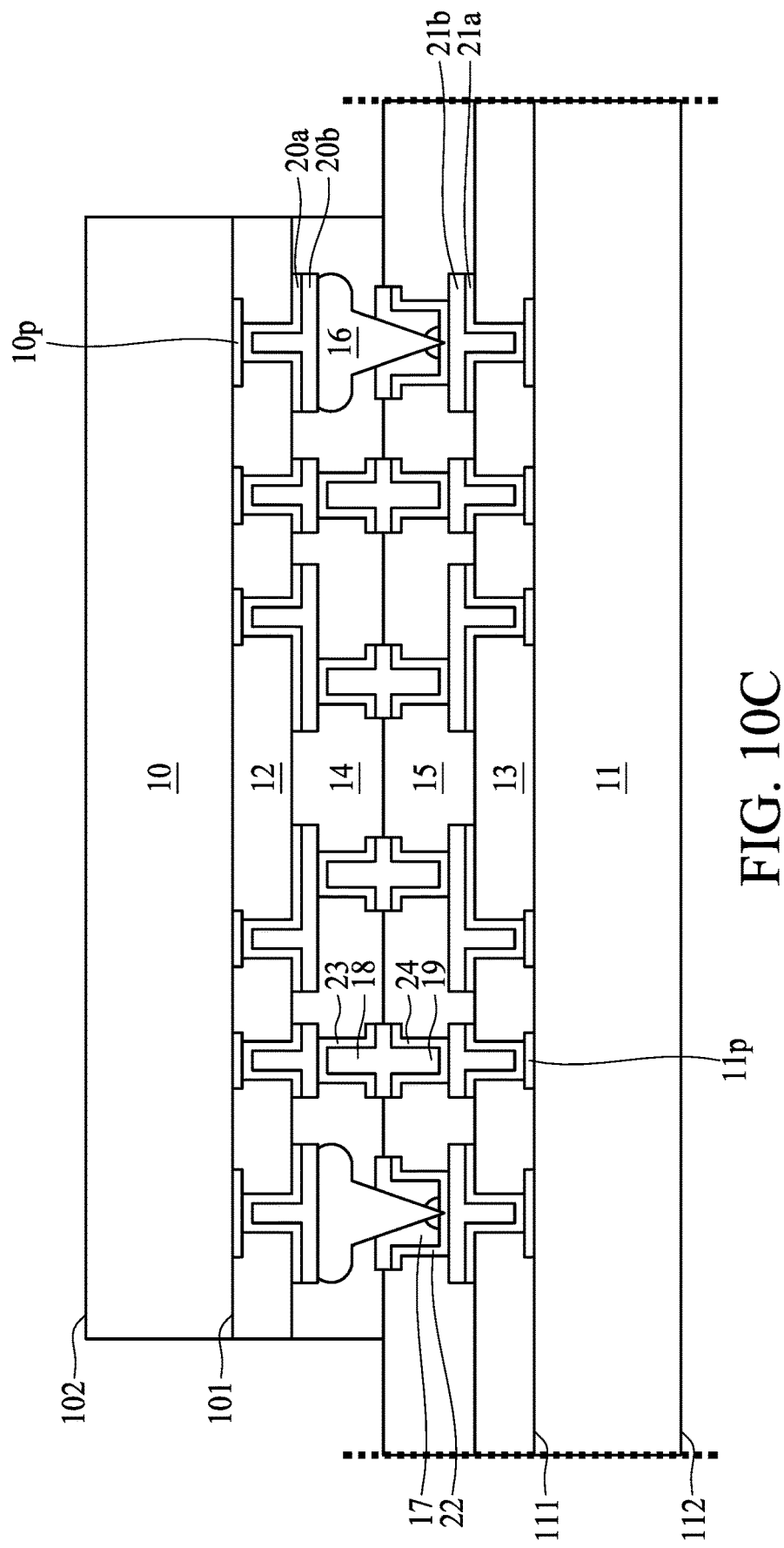
FIG. 10C illustrates one or more stages of a method of manufacturing a semiconductor device package in accordance with some embodiments of the present disclosure.

FIG. 10A, FIG. 10B, and FIG. 10C are cross-sectional views of a semiconductor device package at various stages of fabrication, in accordance with some embodiments of the present disclosure. At least some of these figures have been simplified for a better understanding of the aspects of the present disclosure.

Referring to FIG. 10A, the first semiconductor structure obtained in the stage of FIG. 8G and the second semiconductor structure obtained in the stage of FIG. 9H are provided. The first semiconductor structure and the second semiconductor structure are aligned with each other, with the surface 101 facing the surface 111. The first semiconductor structure and the second electronic may be aligned by using the electrical contact 16 as anchors. After the alignment, the first semiconductor structure and the second semiconductor structure is placed closer until a part of the electrical contact 16 stabs or is squeezed into the electrical contact 17 and/or the conductive layer 22 to deform the electrical contact 17 and/or the conductive layer 22.

Referring to FIG. 10B, a heat treatment is performed, such as an annealing operation, a sintering operation or a curing operation.

Referring to FIG. 10C, singulation may be performed to separate out individual semiconductor device packages. The singulation may be performed, for example, by using a dicing saw, laser or other appropriate cutting technique.

Figure 11B:
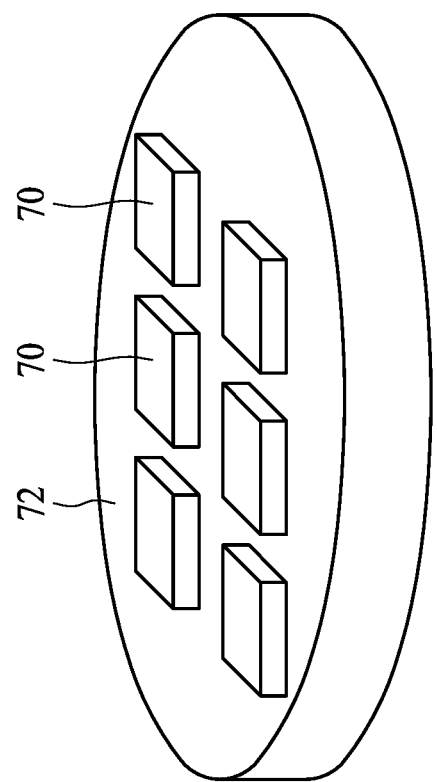
FIG. 11B illustrates examples of various types of semiconductor device packages in accordance with some embodiments of the present disclosure.
Figure 11A:
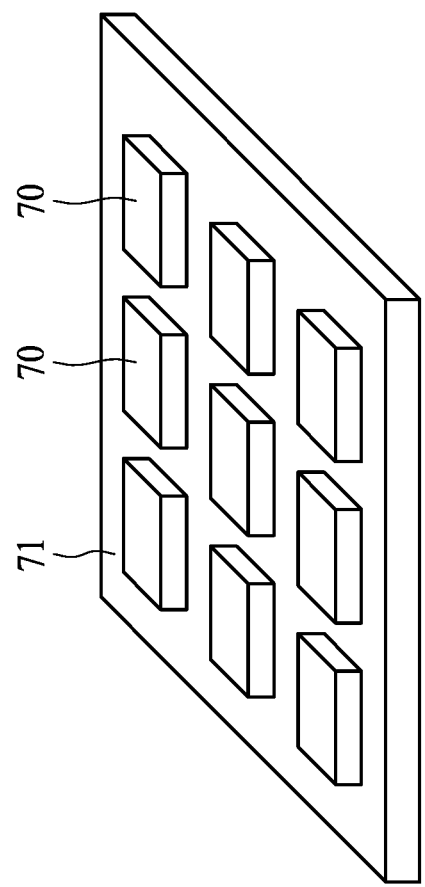
FIG. 11A illustrates examples of various types of semiconductor device packages in accordance with some embodiments of the present disclosure.

FIG. 11A and FIG. 11B illustrate examples of different types of semiconductor device packages in accordance with some embodiments of the present disclosure.

As shown in FIG. 11A, a plurality of chips 70 and/or dies are placed on a square-shaped carrier 71. In some embodiments, the chips 70 may include at least one of the semiconductor device packages 1-9 as shown in FIGS. 1A, 2A, 2B, 2C, 3, 4, 5, 6A and 6B. In some embodiments, the carrier 71 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

As shown in FIG. 11B, a plurality of chips 70 and/or dies are placed on a circle-shaped carrier 72. In some embodiments, the carrier 72 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As sued herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 µm, within 5 µm, within 1 µm, or within 0.5 µm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a first substrate having a first surface;
a first electrical contact disposed on the first surface of the first substrate, the first electrical contact having a base portion and a protrusion portion;
a second substrate having a second surface facing the first surface of the first substrate; and
a second electrical contact disposed on the second surface of the second substrate and covering at least a portion of the protrusion portion of the first electrical contact, the second electrical contact having a first surface facing the first substrate and a second surface facing the second substrate;
a first dielectric layer disposed on the second surface of the second substrate, the first dielectric layer having a first surface facing the first substrate, the first dielectric layer having a recess from the first surface of the first dielectric layer toward the second substrate; and
a conductive layer disposed on a sidewall and a bottom surface of the recess of the first dielectric layer,
wherein a slope of a first interface between the second electrical contact and the protrusion portion of the first electrical contact adjacent to the first surface of the second electrical contact is substantially the same as a slope of a second interface between the second electrical contact and the protrusion portion of the first electrical contact adjacent to the second surface of the second electrical contact,
wherein the second electrical contact is disposed within the recess and on the conductive layer,
wherein the protrusion portion of the first electrical contact penetrates the second electrical contact and is in contact with the conductive layer, and
wherein the protrusion portion of the first electrical contact penetrates at least a portion of the conductive layer.

2. The semiconductor device package as claimed in claim 1, further comprising a bump structure within the recess and surrounds a contact point between the protrusion portion of the first electrical contact and the conductive layer.

3. The semiconductor device package as claimed in claim 1, further comprising a second dielectric layer disposed on the first surface of the first substrate and covering the base portion and a portion of the protrusion portion of the first electrical contact.

4. The semiconductor device package as claimed in claim 1, further comprising:
a third electrical contact disposed on the first surface of the first substrate and spaced apart from the first electrical contact; and
a fourth electrical contact disposed on the second surface of the second substrate and spaced apart from the second electrical contact,
wherein the third electrical contact is in contact with the fourth electrical contact.

5. The semiconductor device package as claimed in claim 4, wherein a grain size at an interface between the third electrical contact and the fourth electrical contact is smaller than a grain size at any other portion of the third electrical contact and the fourth electrical contact distal from the interface therebetween.

6. The semiconductor device package as claimed in claim 4, wherein a grain density at an interface between the third electrical contact and the fourth electrical contact is higher than a grain density at any other portion of the third electrical contact and the fourth electrical contact distal from the interface therebetween.

7. A semiconductor device package, comprising:
a first substrate having a first surface;
a first electrical contact disposed on the first surface of the first substrate, the first electrical contact having a base portion and a protrusion portion;
a second substrate having a second surface facing the first surface of the first substrate; and
a second electrical contact disposed on the second surface of the second substrate and covering at least a portion of the protrusion portion of the first electrical contact, the second electrical contact having a first surface facing the first substrate and a second surface facing the second substrate,
wherein a grain size of the first electrical contact adjacent to an interface between the protrusion portion of the first electrical contact and the second electrical contact is smaller than a grain size at any other portion of the first electrical contact distal from the interface.

8. The semiconductor device package as claimed in claim 7, wherein the first interface and the second interface are substantially void free.

9. The semiconductor device package as claimed in claim 7, further comprising:
a first dielectric layer disposed on the second surface of the second substrate, the first dielectric layer having a first surface facing the first substrate, the first dielectric layer having a recess from the first surface of the first dielectric layer toward the second substrate; and
a conductive layer disposed on a sidewall and a bottom surface of the recess of the first dielectric layer,
wherein the second electrical contact is disposed within the recess and on the conductive layer.

10. The semiconductor device package as claimed in claim 9, wherein the protrusion portion of the first electrical contact penetrates the second electrical contact and is in contact with the conductive layer.

11. The semiconductor device package as claimed in claim 10, wherein the protrusion portion of the first electrical contact penetrates at least a portion of the conductive layer.

12. The semiconductor device package as claimed in claim 11, further comprising a bump structure within the recess and surrounds a contact point between the protrusion portion of the first electrical contact and the conductive layer.

13. The semiconductor device package as claimed in claim 7, further comprising a second dielectric layer disposed on the first surface of the first substrate and covering the base portion and a portion of the protrusion portion of the first electrical contact.

14. The semiconductor device package as claimed in claim 7, further comprising:
- a third electrical contact disposed on the first surface of the first substrate and spaced apart from the first electrical contact; and
- a fourth electrical contact disposed on the second surface of the second substrate and spaced apart from the second electrical contact,
- wherein the third electrical contact is in contact with the fourth electrical contact.

15. The semiconductor device package as claimed in claim 14, wherein a grain density at an interface between the third electrical contact and the fourth electrical contact is higher than a grain density at any other portion of the third electrical contact and the fourth electrical contact distal from the interface therebetween.

16. The semiconductor device package as claimed in claim 1, wherein an interface between the protrusion portion of the first electrical contact and the conductive layer is substantially void free.

17. The semiconductor device package as claimed in claim 7, wherein a hardness of the first electrical contact is greater than a hardness of the second electrical contact.

\* \* \* \* \*